United States Patent
Suwa

(12) 
(10) Patent No.: US 6,191,429 B1
(45) Date of Patent: *Feb. 20, 2001

(54) PROJECTION EXPOSURE APPARATUS AND METHOD WITH WORKPIECE AREA DETECTION

(75) Inventor: Kyoichi Suwa, Tokyo (JP)

(73) Assignee: Nikon Precision Inc., Belmont, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 09/287,702

(22) Filed: Apr. 6, 1999

Related U.S. Application Data

(60) Continuation of application No. 09/134,778, filed on Aug. 11, 1998, now abandoned, which is a division of application No. 08/727,695, filed on Oct. 9, 1996, now Pat. No. 5,825, 043.

(51) Int. Cl.[7] .............................. G01J 1/20; G01N 21/86
(52) U.S. Cl. ............................ 250/548; 355/55; 356/399
(58) Field of Search .................................. 250/548, 557, 250/201.2, 201.4; 355/53, 54, 55, 56; 356/399, 400, 401

(56) References Cited

U.S. PATENT DOCUMENTS

| | | | |
|---|---|---|---|
| 4,346,164 | 8/1982 | Tabarelli et al. | 430/311 |
| 4,391,494 | 7/1983 | Hershel | 350/442 |
| 4,650,983 | 3/1987 | Suwa | 250/204 |

(List continued on next page.)

FOREIGN PATENT DOCUMENTS

| | | |
|---|---|---|
| 61-209831 | 9/1986 | (JP). |
| 6-204115 | 7/1994 | (JP). |

(List continued on next page.)

OTHER PUBLICATIONS

Burn J. Lin, "The Paths To Subhalf–Micrometer Optical Lithography", SPIE vol. 922, Optical/Laser Microlithography (1988), pp. 256–269.

(List continued on next page.)

Primary Examiner—John R. Lee
Assistant Examiner—Kevin Pyo
(74) Attorney, Agent, or Firm—Skjerven Morrill MacPherson LLP; Norman R. Klivans; Mark E. Schmidt

(57) ABSTRACT

Improvements in a focusing apparatus having an objective optical system for optically manufacturing a workpiece, forming a desired pattern on a surface of a workpiece or inspecting a pattern on a workpiece and used to adjust the state of focusing between the surface of the workpiece and the objective optical system. The focusing apparatus has a first detection system having a detection area at a first position located outside the field of the objective optical system, a second detection system having a detection area at a second position located outside the field of the objective optical system and spaced apart from the first position, and a third detection system having a detection area at a third position located outside the field of the objective optical system and spaced apart from each of the first and second positions. A calculator calculates a deviation between a first focus position and a target focus position and temporarily stores a second focus position at the time of detection made by the first detection system. A controller controls focusing on the surface of the workpiece on the basis of the calculated deviation, the stored second focus position and a third focus position when the area on the workpiece corresponding to the detection area of the first detection system is positioned in the field of the objective optical system by relative movement of the workpiece and the objective optical system.

14 Claims, 17 Drawing Sheets

U.S. PATENT DOCUMENTS

| | | | |
|---|---|---|---|
| 4,747,678 | 5/1988 | Shafer et al. | 350/505 |
| 5,194,893 | 3/1993 | Nishi | 355/53 |
| 5,298,939 | 3/1994 | Swanson et al. | 355/53 |
| 5,448,322 | 9/1995 | Sakakibara et al. | 355/53 |
| 5,483,056 | 1/1996 | Imai | 250/548 |
| 5,610,683 | 3/1997 | Takahashi | 355/53 |
| 5,646,413 | 7/1997 | Nishi | 250/548 |
| 5,650,840 | 7/1997 | Taniguchi | 250/548 |
| 5,715,039 | 2/1998 | Fukuda et al. | 355/53 |
| 5,742,067 | 4/1998 | Imai | 250/548 |
| 5,751,428 | 5/1998 | Kataoka et al. | 356/401 |
| 5,825,043 * | 10/1998 | Suwa | 250/548 |

FOREIGN PATENT DOCUMENTS

| | | |
|---|---|---|
| 7-86136 | 3/1995 | (JP) . |
| 7-86137 | 3/1995 | (JP) . |
| 7-220998 | 8/1995 | (JP) . |
| 8-162401 | 6/1996 | (JP) . |

OTHER PUBLICATIONS

J. Buckley et al., "Step and scan: A systems overview of a new lithography tool", SPIE vol. 1088, Optical/Laser Microlithography II, 1989, pp. 424–433.

* cited by examiner

PROJECTION EXPOSURE APPARATUS AND METHOD WITH WORKPIECE AREA DETECTION

This application is a continuation of Ser. No. 09/134,778 filed Aug. 11, 1998, now abandoned, which in turn is a divisional application of Ser. No. 08/727,695, filed Oct. 7, 1996, now U.S. Pat. No. 5,825,043.

BACKGROUND OF THE INVENTION

1. Field of the Invention

The present invention relates to semiconductor fabrication and more particularly to a lithography exposure apparatus (aligner) for transferring a circuit pattern from a mask or a reticle onto a sensitive substrate.

The present invention also relates to a system for detecting a focal point on a workpiece (wafer, substrate or plate etc.) and for detecting a tilt of the workpiece, which is applicable to certain kinds of apparatus such as an apparatus for manufacturing a workpiece or imaging a desired pattern in a surface of a workpiece using a laser or electron beam and an apparatus for optically inspecting the state of a surface of a workpiece.

2. Description of the Related Art

Recently, dynamic random access memory semiconductor chips (DRAMs) having an integration density of 64 Mbits have been mass-produced by semiconductor fabrication techniques. Such chips are manufactured by exposing a semiconductor wafer to images of circuit patterns to form e.g. ten or more layers of circuit patterns in a superposition manner.

Presently, lithography apparatuses used for such chip fabrication are projection aligners in which a circuit pattern drawn in a chromium layer on a reticle (mask plate) is transferred onto a resist layer on a wafer surface through a 1/4 or 1/5 reduction optical imaging system by irradiating the reticle with i-line radiation (wavelength: 365 nm) of a mercury discharge lamp or pulse light having a wavelength of 248 nm from a KrF excimer laser.

Projection exposure apparatuses (projection aligners) used for this purpose are generally grouped, according to the types of imaging optical system, into those using a step-and-repeat system, i.e., so-called steppers, and those using a step-and-scan system which has attracted attention in recent years.

In the step-and-repeat system, a process is repeated in which, each time a wafer is moved to a certain extent in a stepping manner, a pattern image on a reticle is projected on a part of the wafer by using a reduction projection lens system formed only of a refractive optical material (lens element) and having a circular image field or an unit magnification projection lens system formed of a refractive optical material (lens element), a prism mirror and a concave mirror and having a noncircular image field to expose a shot area on the wafer or plate to the pattern image.

In the step-and-scan system, a wafer is exposed to an image of a portion of a circuit pattern on a reticle (for example, in the form of a circular-arc slit) which is projected on the wafer through a projection optical system. Simultaneously, the reticle and the wafer are continuously moved at constant speeds at a speed ratio according to the projection magnification, thus exposing one shot area on the wafer to the image of the entire circuit pattern on the reticle in a scanning manner.

For example, as described on pp 256 to 269 of SPIE Vol. 922 Optical/Laser Microlithography (1988), the step-and-scan system is arranged so that, after one shot area on the wafer has been scanned and exposed, the wafer is moved one step for exposure of an adjacent shot area, and so that the effective image field of the projection optical system is limited to a circular-arc slit. Also, the projection optical system is considered to be a combination of a plurality of refractive optical elements and a plurality of reflecting optical elements, such as one disclosed in U.S. Pat. No. 4,747,678 (to Shafer).

U.S. Pat. No. 5,194,839 (to Nishi) discloses an example of an aligner in which a step-and-scan system is realized by mounting a stepper reduction projection lens having a circular image field. This publication also discloses a method in which a pattern image projected at the time of scanning exposure is transferred onto a wafer by increasing the depth of focus (DOF) by a predetermined amount on the wafer.

In the field of lithography technology, it is now desirable to be able to fabricate semiconductor memory chips having an integration density and fineness of the 1 or 4 Gbit class by light exposure. Since light exposure techniques have a long technological history and are based on a large amount of accumulated know-how, it is convenient to continue use of light exposure techniques. It is also advantageous to use light exposure techniques considering drawbacks of alternative electron beam exposure or X-ray technologies.

It is believed that resolutions in terms of minimum line width (feature width) of about 0.18 $\mu$m and 0.13 $\mu$m are required with respect to 1 Gbit and 4 Gbit memory chips, respectively. To achieve resolution of such a line width, far ultraviolet rays having a wavelength of 200 nm or shorter, e.g., those produced by an ArF excimer laser, are used for illumination for irradiating the reticle pattern.

As optical vitreous materials having a suitable transmittance with respect to far ultraviolet rays (having a wavelength of 400 nm or shorter), quartz ($S_iO_2$), fluorite $CaF_s$, lithium fluoride ($L_iF_2$), magnesium fluoride ($MgF_2$) and so on are generally known. Quartz and fluorite are optical vitreous materials indispensable for forming a projection optical system having high resolution in the range of far ultraviolet rays.

However, it is necessary to consider the fact that, if the numerical aperture (NA) of a projection optical system is increased to attain high resolution while the field size is increased, the diameter of lens elements made of quartz or fluorite becomes so large that it is difficult to manufacture such lens elements.

Also, if the numerical aperture (NA) of the projection optical system is increased, the depth of focus (DOF) $\Delta F$ is inevitably reduced. In general, the depth of focus $\Delta F$ is defined by wavelength, numerical aperture NA, a process coefficient Kf (0<Kf<1) as shown below if the Rayleigh's theory of imaging formation is applied:

$$\Delta F = Kf \cdot (\lambda/NA^2)$$

Accordingly, the depth of focus $\Delta F$ in the atmosphere (air) is about 0.240 $\mu$m if the wavelength is 193 nm, that is, equal to that of ArF excimer laser light, the numerical aperture NA is set to about 0.75 and the process coefficient Kf is 0.7. In this case, the theoretical resolution (minimum line width) $\Delta R$ is expressed by the following equation using process coefficient Kr (0<Kf<1):

$$\Delta R = Kr \cdot (\lambda/NA)$$

Accordingly, under the above-mentioned conditions, the resolution $\Delta R$ is about 0.154 $\mu$m if the process coefficient Kr is 0.6.

As described above, while it is necessary to increase the numerical aperture of the projection optical system in order to improve the resolution, it is important to notice that the depth of focus decreases abruptly if the numerical aperture is increased. If the depth of focus is small, there is a need to improve the accuracy, reproducibility and stability with which an automatic focusing system for coincidence between the best imaging plane of the projection optical system and the resist layer surface on the wafer is controlled.

On the other hand, considering the projection optical system from the standpoint of design and manufacturing, a configuration is possible in which the numerical aperture is increased without increasing the field size. However, if the numerical aperture is set to a substantially larger value, the diameter of lens elements is so large that it is difficult to form and work the optical vitreous material (e.g. quartz and fluorite).

Then, as a means for improving the resolution without largely increasing the numerical aperture of the projection optical system, an immersion projection method may be used in which the space between the wafer and the projection optical system is filled with a liquid, see U.S. Pat. No. 4,346,164 (to Tabarelli).

In this immersion projection method, the air space between the wafer and the optical element constituting the projection optical system on the projection end side (image plane side) is filled with a liquid having a refractive index close to the refractive index of the photoresist layer, to increase the effective numerical aperture of the projection optical system seen from the wafer side, i.e. improving the resolution. This immersion projection method is expected to attain good imaging performance by selecting the liquid used.

Projection aligners as presently known generally are provided with an automatic focusing (AF) system for precisely controlling the relative positions of the wafer and the projection optical system so that the wafer surface coincides with the optimum imaging plane (reticle conjugate plane) of the projection optical system. This AF system includes a surface position detection sensor for detecting a change in the height position (Z-direction position) of the wafer surface in a non-contact manner, and a Z-adjustment mechanism for adjusting the spacing between the projection optical system and the wafer on the basis of the detected change.

Also in projection aligners presently used an optical type or air micrometer type sensor is used as the surface position detection sensor, and a holder (and a Z-stage) for supporting the wafer, provided as the Z-adjustment mechanism, is moved vertically to sub-micron accuracy.

If such an AF system is provided in an aligner to which the immersion projection method is applied, it is natural that an air micrometer type sensor cannot be used and an optical sensor is exclusively used since the wafer is held in a liquid. In such a case, an optical focus sensor, such as one disclosed in U.S. Pat. No. 4,650,983 (to Suwa), for example, is constructed so that a measuring beam (an imaging beam of a slit image) is obliquely projected into the projection field on the wafer and so that the beam reflected by the wafer surface is received by a photoelectric detector through a light receiving slit. The change in the height position of the wafer surface, i.e., the amount of focus error, is detected from a change in the position of the reflected beam occurring at the light receiving slit.

If an oblique incident light type focus sensor such as the one disclosed in U.S. Pat. No. 4,650,983 is directly mounted in a projection aligner in which the conventional projection optical system having a working distance of 10 to 20 mm is immersed in a liquid, a problem described below arises. In such a case, it is necessary to set in the liquid the optical system of the projected beam emitted from a projecting objective lens of the focus sensor to reach the projection field of the projection optical system on the wafer and the optical system of the reflected beam reflected by the wafer to reach a light receiving objective lens.

Therefore, the beam of the focus sensor travels through a long distance in the liquid, so that unless the temperature distribution in the liquid is stabilized with high accuracy, the projected beam and the received beam fluctuate by a change in refractive index due to a temperature nonuniformity, resulting in deterioration in the accuracy of focus detection (detection of the height position of the wafer surface).

Moreover, to achieve a resolution of 0.15 $\lambda$m or less by the immersion projection method, it is necessary to set the working distance of the projection optical system to a sufficiently small value, as mentioned above. Therefore, oblique projection itself of the projected beam of the oblique incident light type focus sensor from the space between the projection optical system and the wafer toward the projection area on the wafer becomes difficult to perform. For this reason, one important question arises as to how an automatic focusing system applicable to the immersion projection method is arranged.

On the other hand, aligners (exposure apparatus) having an unit magnification type (hereinafter described as "1×") projection optical systems are being used in the field of manufacturing liquid crystal display devices (flat panel displays) as well as in the field of manufacturing semiconductor devices. Recently, for this kind of aligner, a system has been proposed in which a plurality of 1× projection optical systems of a certain type are arranged and in which a mask and a photosensitive plate are moved integrally with each other for scanning. It is desirable that, ideally, the working distance of the 1× projection optical systems used is extremely small. Each 1× projection optical system is of a single Dyson type such as that disclosed in U.S. Pat. No. 4,391,494 (to Hershel) or a double Dyson type such as that disclosed in U.S. Pat. No. 5,298,939 (to Swanson et al.).

In an aligner having such a Dyson type projection optical system, the working distance (spacing between the exit surface of a prism mirror and the image plane) can be sufficiently reduced to limit various aberrations or distortions of the projected image to such small values that there is practically no problem due to the aberrations or distortions. In this kind of aligner, therefore, a detection area on the photosensitive substrate of focus detection by the focus sensor (e.g., the irradiation position of the projected beam in the oblique incident light system or the air-exhaust position in the air micrometer system) is ordinarily set to a position deviating from the effective projection field region of the projection optical system, that is, set in an off-axis manner.

For this reason, it is impossible to actually detect whether the area of the substrate exposed to projected light from a circuit pattern is precisely adjusted in a best focus state or condition.

Also in apparatuses for writing a pattern on a substrate or to perform processing (or manufacturing) by using a spot of a laser beam or an electron beam, it is possible that the working distance between the substrate and the objective lens system (or an electronic lens system) for projecting the beam becomes so small that an AF sensor capable of detecting a focusing error of the processing position or the drawing position on the substrate surface in the field of the objective optical system cannot be mounted.

In such a case, the detection point of the AF sensor is only placed outside the field of the objective lens system to detect a focusing error, and it does not detect whether a focusing error occurs actually at the processing position or writing position in the field of the objective lens system.

The same can also be said with respect to an apparatus for optically inspecting a pattern drawn on a reticle or mask for photolithography or a fine pattern formed on a wafer. That is, this is because this kind of inspection apparatus is also provided with an objective lens system for inspection and because the end of the objective lens system faces a surface of an specimen (a plate) to be inspected while being spaced apart from same by a predetermined working distance.

Thus, if an objective lens system having a comparatively large magnifying power and high resolution is used, the working distance is so small that the same problem relating to the disposition of the AF sensor is encountered.

SUMMARY OF THE INVENTION

In view of the above-described problems of the related art, the present invention provides a projection aligner (exposure apparatus) and an exposure method which enable high-precision focusing control and high-precision tilt control even if a projection optical system to reduce the working distance in comparison with the conventional projection optical system is incorporated.

The invention is directed to a step-and-repeat aligner in which a surface of a sensitive substrate is exposed to a pattern image projected through an imaging system or a scanning exposure apparatus (scanning aligner) in which a mask (or a reticle) and a sensitive substrate are moved relative to an imaging system while a pattern image is being projected, and to a system suitable for detecting a focal point and a tilt in these kinds of exposure apparatus (aligners).

In the present exposure apparatus and method, focusing control and tilt control are performed with respect to a shot area at a peripheral position on a sensitive substrate.

The present scanning exposure apparatus and scanning exposure method enable high-precision focusing control and high-precision tilt control with respect to an exposed area of a sensitive substrate, without setting a focus detection area in the projection field of a projection optical system.

The present focus sensor and focus detection method stably detect an error in focusing or tilting of a surface of a sensitive substrate immersed in a liquid in an immersion type projection aligner or scanning aligner designed to improve the depth of focus. The present focus sensor and focus detection method are suitable for a manufacturing (processing) apparatus, a drawing apparatus or an inspection apparatus having an objective optical system of a small working distance.

The present invention is applicable to a scanning exposure apparatus having an imaging system (a projection lens system) for projecting an image of a pattern of a mask (a reticle) on a substrate (a wafer) through an imaging field, a scanning mechanism (a reticle stage or wafer XY stage) for moving the mask and the substrate in a scanning direction relative to the imaging system, and a Z-drive system (a Z stage and Z-actuators) for driving the substrate and the imaging system relative to each other in a Z-direction to focus the projected image, or to a projection aligner (i.e, stepper) having an imaging system for projecting an image of a pattern of a mask on a substrate through a projection field, a movable stage mechanism which moves in X and Y directions in order to position the substrate with respect to the image of the pattern to be projected, and a Z-drive mechanism for driving the substrate and the imaging system relative to each other in a Z-direction to focus the image to be projected.

The scanning mechanism or the movable stage mechanism of the exposure apparatus or aligner may be a mechanism for horizontally maintaining a mask or substrate. Alternatively, it may be a mechanism for maintaining a mask or substrate at a certain angle from a horizontal plane, for example, a vertical stage mechanism for moving a mask or substrate in a horizontal or vertical direction while maintaining the mask or substrate in a vertical attitude. In this case, a plane along which the mask or substrate is moved corresponds to X- and Y-directions, and Z-direction, perpendicular to each of X- and Y-directions, is also referred to (for example, in correspondence with the direction of the optical axis of a laterally-arranged projection optical system or the direction of principal rays).

According to the present invention, the aligner is provided with a first detection system having a detection area at a first position located outside the imaging field of the imaging system and spaced apart from same in the scanning direction (Y-direction), the first detection system detecting the position of an obverse (upper) surface of the substrate in the Z-direction, a second detection system having a detection area at a second position located outside the imaging field of the imaging system and spaced apart from the first position in a direction (X) the scanning direction (Y), the second detection system detecting the position of the obverse surface of the substrate in the Z-direction, a third detection system having a detection area at a third position located outside the imaging field of the imaging system, spaced apart from the same in a direction (X) perpendicular to the scanning direction (Y) and also spaced apart from the second position in the scanning direction (Y), and the third detection system detecting the position of the obverse surface of the substrate in the Z-direction.

According to the present invention, the aligner is further provided with a calculator for calculating a deviation between the first Z-position detected by the first detection system and a target Z-position, and for temporarily storing the second Z-position detected by the second detection system at the time of detection made by the first detection system, and a controller for controlling the Z-drive system on the basis of the calculated deviation the stored second Z-position and the third Z-position detected by the third detection system when the area on the substrate corresponding to the detection area of the first detection system is positioned in the imaging field of the imaging system by a movement caused by the scanning mechanism or the movable stage mechanism.

The present invention is applicable to a scanning exposure method in which all of a pattern of a mask (a reticle) is transferred onto a sensitive substrate (a wafer) by projecting a part of the mask pattern on the sensitive substrate through a projection optical system and by simultaneously moving the mask and the sensitive substrate relative to a projection field of the projection optical system.

The present method includes the steps of mounting the sensitive substrate on a holder having an auxiliary plate portion formed so as to surround the sensitive substrate at a height substantially equal to the height of an obverse surface of the sensitive substrate, previously reading a focus error of an exposure area on the sensitive substrate on which area a part of the pattern of the mask is to be projected, the focus error of the exposure area being read before the exposure area reaches the projection field of the projection optical system during scanning movement of the holder and the sensitive substrate, detecting a focus error of the obverse surface of a part of the sensitive substrate or the auxiliary plate portion by an exposure position focus detection system disposed apart from the projection field of the projection optical system in a direction (X) perpendicular to the direction (Y) of the scanning movement when the exposure area on the sensitive substrate reaches the projection field, adjusting the distance between the projection optical system and the sensitive substrate on the basis of the detected focus errors so that the focus error of the exposure area on the sensitive substrate is corrected in the projection field of the projection optical system.

A focus detection sensor or a focus detection method suitable for manufacturing (processing) apparatuses, imaging apparatuses and inspection apparatuses is achieved similarly by replacing the projecting optical system used for the above-described exposure apparatus (aligner) or the exposure method with an objective optical system for manufacturing, writing, imaging or inspection.

DETAILED DESCRIPTION

Figure 1:
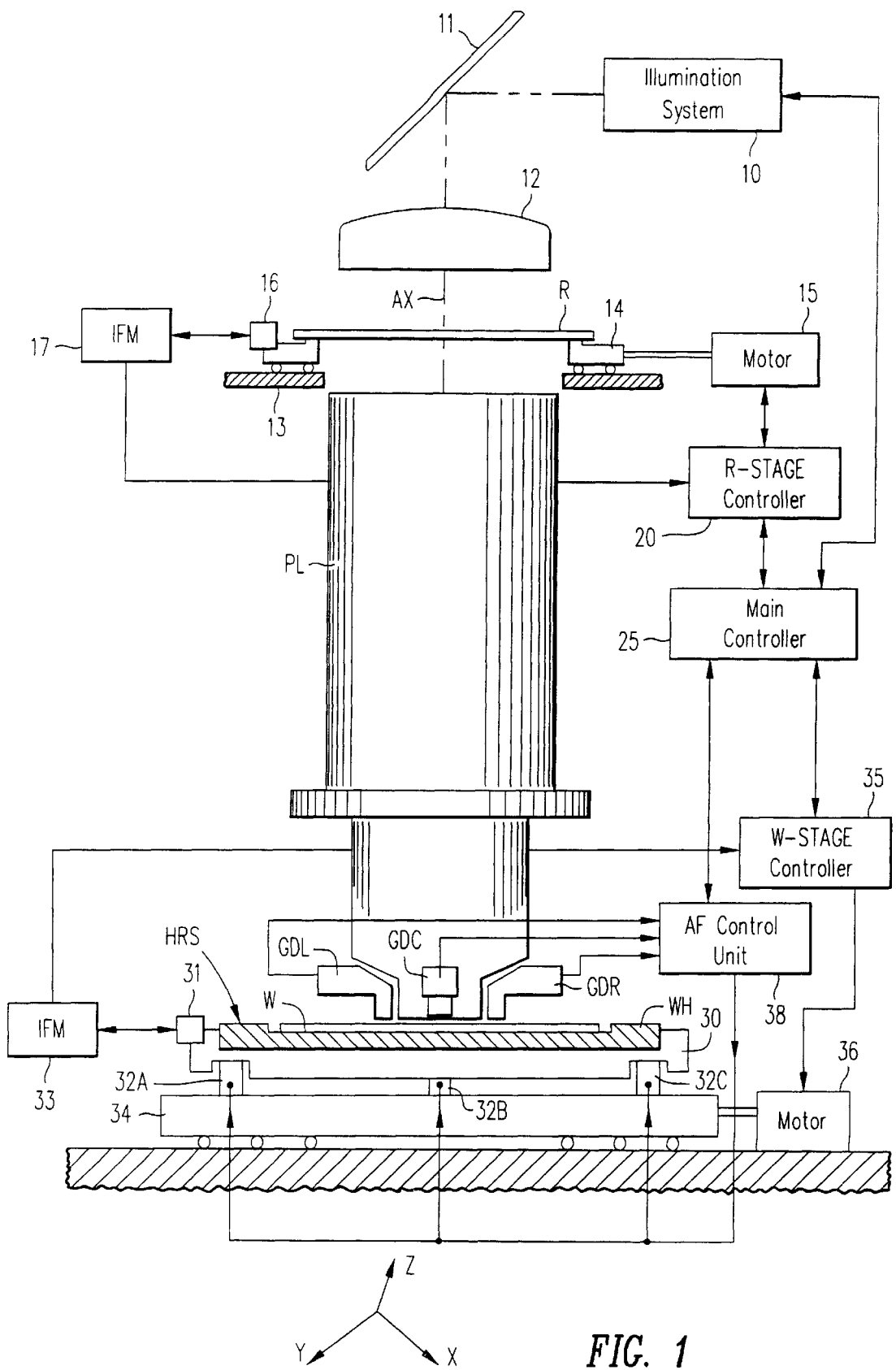
FIG. 1 is a diagram showing a scanning projection exposure apparatus (aligner) in a first embodiment of the present invention.

FIG. 1 shows the entire construction of a projection exposure apparatus in a first embodiment of the present invention, and which is a lens-scan type projection aligner in which a circuit pattern on a reticle is projected onto a semiconductor wafer through a reduction projection lens system having circular image fields telecentrically formed on the object side and the image side while the reticle and the wafer are being moved relative to the projection lens system to be scanned.

An illumination system shown in FIG. 1 includes an ArF excimer laser light source for emitting pulse light having a wavelength of 193 nm, a beam expander for shaping a cross section of the pulse light from the light source into a predetermined shape, an optical integrator such as a fly's-eye lens for forming a secondary light source image (a set of a plurality of point light sources) by receiving the shaped pulse light, a condenser lens system for condensing the pulse light from the secondary light source image into pulse illumination light having a uniform illuminance distribution, a reticle blind (illumination field stop) for shaping the pulse illumination light into a rectangular shape elongated in a direction perpendicular to the scanning direction at the time of scanning exposure, and a relay optical system for imaging the rectangular opening of the reticle blind on a reticle R in cooperation with a mirror 11 and a condenser lens system 12 shown in FIG. 1.

The reticle R is supported on a reticle stage 14 by vacuum suction attraction. The reticle stage 14 can move at a constant speed in one dimension with a large stroke during scanning exposure. The reticle stage 14 is guided on a column structure 13 of an aligner body laterally as viewed in FIG. 1 to move for scanning. The reticle stage 14 is also guided so as to move in a direction perpendicular to the plane of the figure.

The coordinate position and the fine rotational deviation of the reticle stage 14 in an XY-plane are successively measured by a laser interferometer system (IFM) 17 which projects a laser beam onto a moving mirror (plane mirror or corner mirror) 16 attached to a portion of the reticle stage 14 and which receives the beam reflected by the mirror 16. A reticle stage controller 20 controls motors 15 (such as a linear motor or a voice coil) for driving the reticle stage 14 on the basis of the XY-coordinate position measured by the interferometer system 17, thereby controlling the scanning movement and the stepping movement of the reticle stage 14.

When a part of a circuit pattern area on the reticle R is irradiated with rectangular shaped pulse of light emitted from the condenser lens system 12, an imaging light beam from the pattern in the illuminated part is projected and imaged on a sensitive resist layer applied on the upper (principal) surface of a wafer W through a 1/4 reduction projection lens system PL. The optical axis AX of the projection lens system PL is placed so as to extend through center points of the circular image fields and to be coaxial with the optical axes of the illumination system 10 and the condenser lens system 12.

The projection lens system PL includes a plurality of lens elements made e.g. of two different materials, such as quartz and fluorite having high transmittance with respect to ultraviolet rays having a wavelength of 193 nm. Fluorite is used mainly to form lens elements having a positive power. The air in the lens barrel in which the lens elements of the projection lens system PL are fixed is replaced with nitrogen gas so as to avoid absorption of the pulse illumination light having a wavelength of 193 nm by oxygen. Similar nitrogen gas replacement is performed with respect to the optical path from the interior of the illumination system 10 to the condenser optical system 12.

The wafer W is held on a wafer holder (chuck) WH which attracts the reverse (backside) surface of the wafer by vacuum suction. An annular auxiliary plate portion HRS is provided on a peripheral portion of the wafer holder WH so as to surround the circumference of the wafer W. The height of the surface of the auxiliary plate portion HRS is so as to be substantially flush with the upper surface of the wafer W attracted to the upper surface of the holder WH. This auxiliary plate portion HRS is used as an alternative focus detection surface if a detection point of a focus sensor is positioned outside the contour edge of the wafer W when a shot area at a peripheral position on the wafer W is scanned and exposed, as described below in detail.

Further, the auxiliary plate portion HRS can also serve as a flat reference plate (fiducial plate) for calibration of a system offset of the focus sensor in the same manner as disclosed in U.S. Pat. No. 4,650,983 (to Suwa) mentioned above. Needless to say, a special reference plate may be separately provided for calibration of the focus sensor.

The wafer holder WH is mounted on a ZL stage 30 which can translate in the Z-direction along the optical axis AX of the projection lens PL, and which can move in a direction perpendicular to the optical axis AX while tilting with respect to an XY-plane. The ZL stage 30 is mounted on an XY stage 34 through three Z-actuators 32A, 32B, and 32C. The XY stage 34 is movable two dimensionally in X- and Y-directions on a base. Each of the Z-actuators 32A, 32B, and 32C is e.g. a piezoelectric expansion element, a voice coil motor, or a combination of a DC motor and a lift cam mechanism.

If the three Z-actuators (or Z-drive motors) are each driven in the Z-direction to the same amount, the ZL stage 30 moves translationally in the Z-direction (focusing direction) while being maintained parallel to the XY stage 34. If the three Z-actuators are each driven in the Z-direction different amounts, an amount and a direction of the tilting of the ZL stage 30 is thereby adjusted.

The two-dimensional movement of the XY stage 34 is caused by several drive motors 36 which are e.g. a DC motor for rotating a feed screw or a linear motor or the like capable of producing a driving force in a non-contact manner. The drive motors 36 are controlled by a wafer stage controller 35 which is supplied with a measuring coordinate position from a laser interferometer (IFM) 33 for measuring changes in the position of a reflecting surface of a moving mirror 31 in the X- and Y-directions.

For example, the entire construction of the XY stage 34 using a linear motor as drive motor 36 may be as disclosed in Japanese Laid-Open Patent Application No.(Sho) 61-209831 (Tateishi Electronics Co.) laid open on Sep. 18, 1986.

With respect to this embodiment, it is assumed here that the working distance of the projection lens PL is so small that a projected beam of an oblique incident light type focus sensor cannot be led to the wafer surface through the space between the surface of the optical element of the projection lens system PL closest to the image plane and the upper surface of the wafer W. In this embodiment, therefore, three focus detection systems GDL, GDC, and GDR of an off-axis type (having a focus detection point out of the projection field of the projection lens PL) are disposed around a lower end portion of the barrel of the projection lens PL.

Of these focus detection systems, the detection systems GDL and GDR are set so as to have focus detection points positioned on the front and rear sides of the projection field with respect to the direction of scanning movement of the wafer W at the time of scanning exposure. When one shot area on the wafer W is scanned and exposed, one of the detection systems GDL ad GDR selected according to the direction of scanning movement (plus direction or minus direction) is operated so as to previously read the change in the surface height position in the shot area before exposure of the wafer to the rectangular projected image.

Accordingly, the focus detection systems GDL and GDR function, for example, as the same pre-read sensors as those of a focus detection system disclosed in U.S. Pat. No. 5,448,332 (to Sakakibara et al.). In this embodiment, however, a focus adjustment (or tilt adjustment) sequence different from that of U.S. Pat. No. 5,448,332 is used and a special focus detection system is therefore added to the focus detection systems GDL and GDR. This arrangement is described below in more detail.

The focus detection system GDC shown in FIG. 1 has a detection point in a non-scanning direction perpendicular to the scanning direction of the projection field of the projection lens PL as seen on the surface of the wafer W (i.e., in an XY plane) in accordance with the off-axis method. However, the focus detection system GDC has another detection point on the back side of the projection lens PL as viewed in FIG. 1 in addition to its detection point on the front side.

The focus detection method in accordance with the present invention is characterized in that the off-axis focus detection system GDC and one of the pre-reading focus detection systems GDL and GDR are operated in cooperation with each other. Details of these focus detection systems are described below.

Information on the height position of a portion of the wafer surface detected by each of the above-described focus detection systems GDL, GDR, and GDC (e.g., an error signal or the like representing the amount of deviation from the best focus position) is input to an automatic focusing (AF) control unit 38. The AF control unit 38 determines an optimal amount of driving of each of the Z-drive motors 32A, 32B, and 32C on the basis of the detection information supplied from the detection systems, and drives the Z-drive motors 32A, 32b, and 32C to perform focusing and tilt adjustment with respect to the area of the wafer W on which the projected image is to be actually imaged.

For this control, each of the focus detection systems GDL and GDR is a multi-point focus sensor having detection points at a plurality of positions (e.g., at least two positions) in the rectangular projection area on the wafer W formed by the projection lens PL, and the AF control unit 38 is capable of tilt adjustment of the wafer W at least in the non-scanning direction (X-direction) as well as focusing.

The aligner shown in FIG. 1 is arranged to perform scanning exposure by moving the XY stage 34 at a constant speed in the Y-direction. The relation of the scanning movement and the stepping movement of the reticle R and the wafer W during scanning exposure will now be described with reference to FIG. 2.

Figure 2:
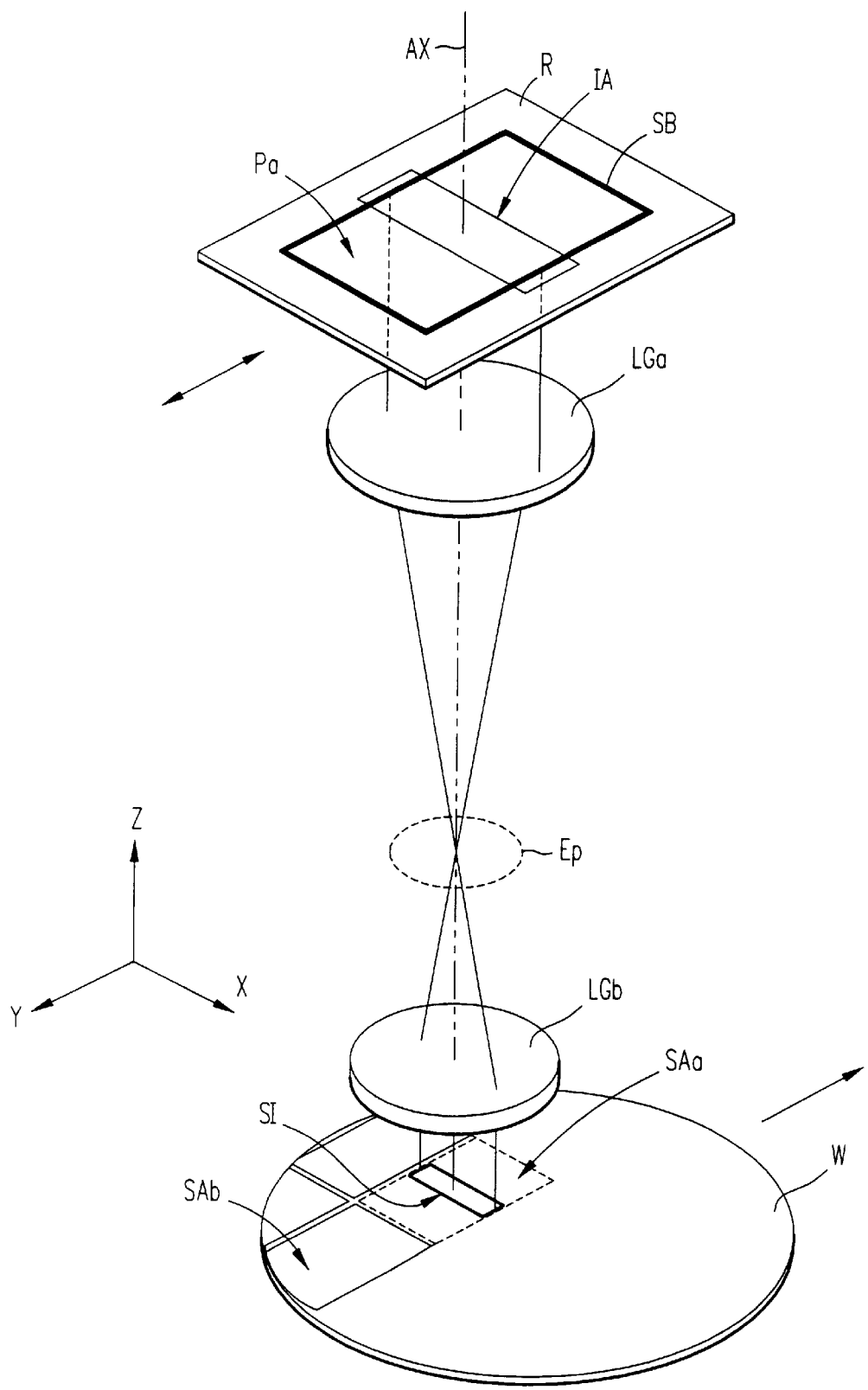
FIG. 2 is a schematic perspective view explaining a scanning exposure sequence.

Referring to FIG. 2, a fore-group lens system LGa and a rear-group lens system LGb represent the projection lens system PL shown in FIG. 1, and an exit pupil Ep exists between the fore-group lens system LGa and the rear-group lens system LGb. On the reticle R shown in FIG. 2, a circuit pattern area Pa having a diagonal length larger than the diameter of the circular image field on the object side of the projection lens PL is formed in a frame defined by a shield band SB.

To the image of the area Pa of the reticle R, a corresponding shot area SAa on the wafer W is exposed in a scanning manner by moving the reticle R at a constant speed Vr in the minus direction along the Y-axis while moving the wafer W at a constant speed Vw in the plus direction along the Y-axis, for example. At this time, the shape of pulse illumination light IA for illuminating the reticle R is set in the form of a parallel strip or a rectangle elongated in the X-direction in the area Pa of the reticle, as shown in FIG. 2. The ends of the shape of pulse illumination light IA opposite from each other in the X-direction are positioned on the shield band SB.

A partial pattern contained in the rectangular area in the area Pa of the reticle R irradiated with the pulse illumination light IA is imaged as an image SI at the corresponding position in the shot area SAa on the wafer W by the projection lens system PL (lens systems LGa and LGb). When the relative scanning of the pattern area Pa on the reticle R and the shot area SAa on the wafer W is completed, the wafer W is moved one step, for example, to a certain distance in the Y-direction such that the scanning start position is set with respect to a shot area SAb adjacent to the shot area SAa. During this stepping movement, the illumination with pulse illumination light IA is stopped.

Next, in order to expose the shot area SAb on the wafer W to the image of the pattern in the area Pa of the reticle R in a scanning manner, the reticle R is moved at the constant speed Vr in the plus direction of the Y-axis relative to pulse illumination light IA and the wafer W is simultaneously moved at the constant speed Vw in the minus direction of the Y-axis relative to the projected image SI. The speed ratio Vw/Vr is set to the reduction ratio 1/4 of the projection lens system PL. In accordance with the above-described schedule, a plurality of shot areas on the wafer W are exposed to the image of the circuit pattern area Pa of the reticle R.

The projection aligner shown in FIGS. 1 and 2 can be used as a step-and-repeat aligner in such a manner that, if the diagonal length of the circuit pattern area on the reticle R is smaller than the diameter of the circuit image field of the projection lens system PL, the shape and size of the opening of the reticle blind in the illumination system 10 are changed so that the shape of illumination light IA conforms to the circuit pattern area. In such a case, the reticle stage 14 and the XY stage 34 are maintained in a relatively-stationary state during exposure of each of shot areas on the wafer W.

However, if the wafer W moves slightly during exposure, the slight movement of the wafer W may be measured by the laser interferometer system 33 and the reticle stage 14 may be slightly moved under control so that the corresponding small error in the position of the wafer W relative to the projection lens system PL is canceled by follow-up correction on the reticle R side. For example, systems for such reticle follow-up correction are disclosed in Japanese Laid-Open Patent Application Nos. (Hei) 6-204115 and (Hei) 7-220998. Techniques disclosed in these publications may be used according to one's need.

If the shape or size of the opening of the reticle blind is changed, a zoom lens system may be provided to enable the pulse light reaching the reticle blind from the light source to be concentrated within the range matching with the adjusted opening according to the change in the shape or size of the opening.

Since the area of the projected image SI is set in the form of a strip or a rectangle elongated in the X-direction as clearly seen in FIG. 2, tilt adjustment during scanning exposure may be effected only along the direction of rotation about the Y-axis, that is, the rolling direction with respect to the scanning exposure direction in this embodiment. Needles to say, if the width of the projected image SI area in the scanning direction is so large that there is a need to consider the influence of flatness of the wafer surface with respect to the scanning direction, tilt adjustment in the pitching direction is performed during scanning exposure. This operation will be described in more detail with respect to another embodiment of the invention.

Figure 3:
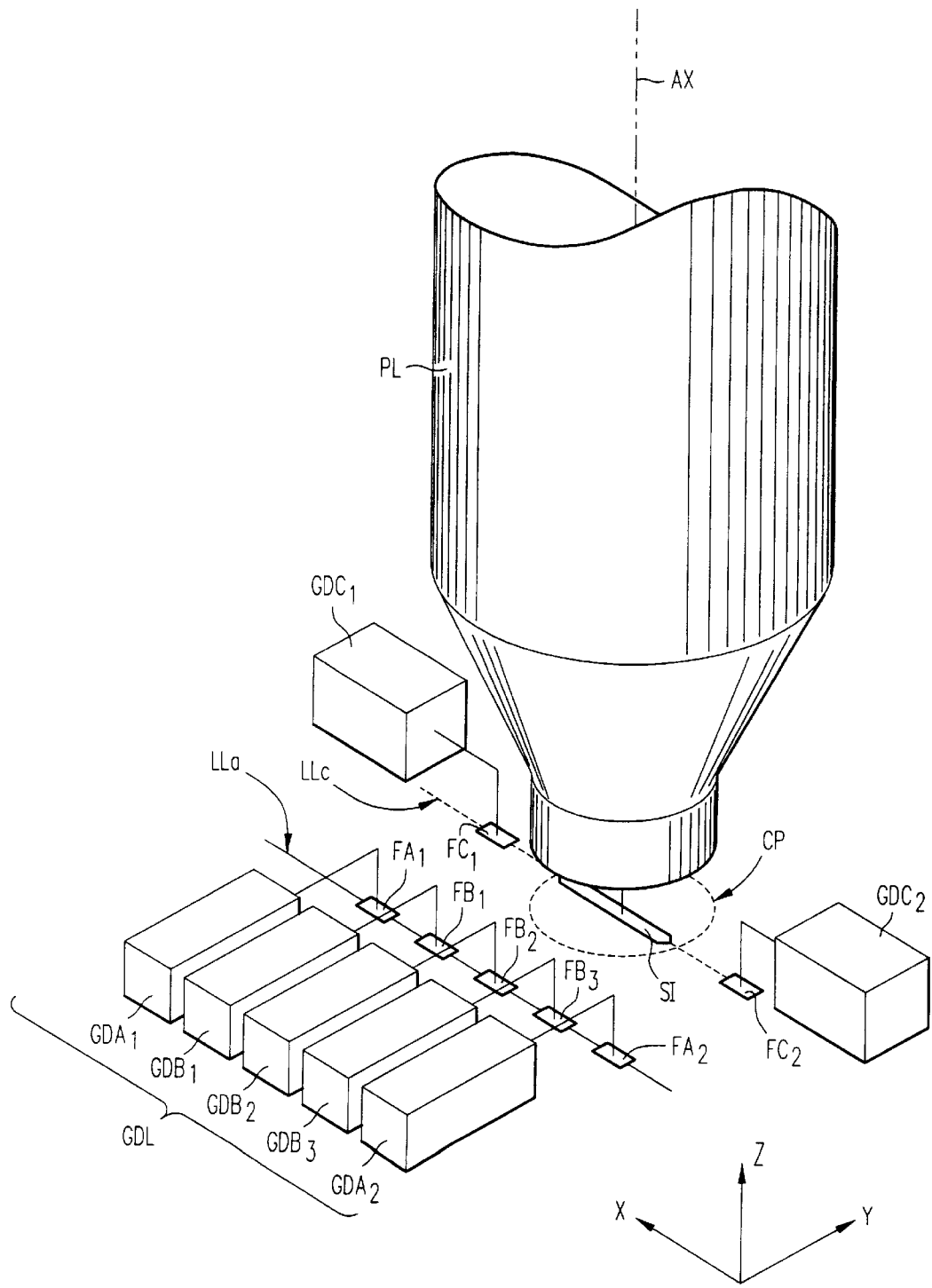
FIG. 3 is a schematic perspective view of the disposition of a focus detection system provided in the vicinity of an end of the projection lens system shown in FIG. 1.

The focus detection systems GDL, GDR, and GDC shown in FIG. 1 are disposed as illustrated in FIG. 3, for example. FIG. 3 is a perspective view showing the disposition of detection points of the focus detection systems on the plane on which the circular image field CP of the projection lens PL on the image side is formed. FIG. 3 shows only the disposition of the focus detection systems GDL and GDC. The focus detection system GDR is omitted since it has the same configuration as the detection system GDL.

Referring to FIG. 3, the focus detection system GDC has two detectors GDC1 and GDC2 which are set so that detection points (detection areas) FC1 and FC2 are positioned on an extension line LLc of the axis of the strip-like of rectangular projected image SI extending in the circular field CP of the projection lens PL in a diametrical direction (X-direction). These detectors GDC1 and GDC2 detect the height position of the upper surface of the wafer W (or auxiliary plate portion HRS) or a positioning error amount in the Z-direction with respect to the best focus plane position.

On the other hand, the focus detection system GDL includes in the embodiment five detectors GDA1, GDA2, GDB1, GBD2, and GDB3 having respective detection points (detection areas) FA1, FA2, FB1, FB2, and FB3 positioned on a straight line LLa parallel to the extension line LLc. Each of these five detectors independently detects the height position of a point on the upper surface of the wafer W (or auxiliary plate portion HRS) or a positioning error amount in the Z-direction with respect to the best focus plane position.

The extension line LLc and the straight line LLa are set at a certain distance from each other in the scanning direction (Y-direction). Also, the detection point FA1 of the detector GDA1 and the detection point FC1 of the detector GDC1 are set at substantially the same coordinate positions in the X-direction while the detection point FA2 of the detector GDA2 and the detection point FC2 of the detector GDC2 are set at substantially the same coordinate positions in the X-direction.

The detection points FB1, FB2, and FB3 of three detectors GDB1, GDB2, and GDB3 are disposed so as to cover the area of the strip-like or rectangular projected image SI in the X-direction. That is, the detection point FB2 is disposed at a X-coordinate position corresponding to the center (the point at which the optical axis AX passes) of the area of the projected image SI in the X-direction while the detection points FB1 and FB3 are disposed at X-coordinate positions corresponding to positions in the vicinity of the opposite ends of the projected image SI area in the X-direction. Therefore, the three detection points FB1, FB2, and FB3 are used for focus error pre-reading of the surface portion of the wafer W corresponding to the projected image SI area.

The focus detection system GDR, not shown in FIG. 3, also has three pre-reading detectors GDE1, GDE2, GDE3 and other two detectors FDD1 and GDD2 disposed opposite sides of these pre-reading detectors in the X-direction. For ease of explanation, with respect to this embodiment, it is assumed that the planes recognized as best focus positions by the twelve detectors GDA1, GDA2; GDB1, GDB2, GDB3; GDC1, GDC2; GDD1, GDD2; GDE1, GDE2, GDE3 are adjusted to one XY-plane. That is, no system offset is provided between the twelve detectors and it is assumed that the surface height positions of the wafer W detected at the twelve detection points FA1, FA2; FB1, FB2, FB3; FC1, FC2; FD1, FD2; FE1, FE2, FE3 as positions at which the detected focus error becomes zero coincide closely with each other.

For the above-described twelve focus detectors, optical sensors, air micrometer type sensors, electrostatic capacity type gap sensors or the like can be used if the end of the projection lens PL is not immersed in a liquid. However, if an immersion projection system is formed, it is, of course, impossible to use air micrometer type sensors.

Figure 4:
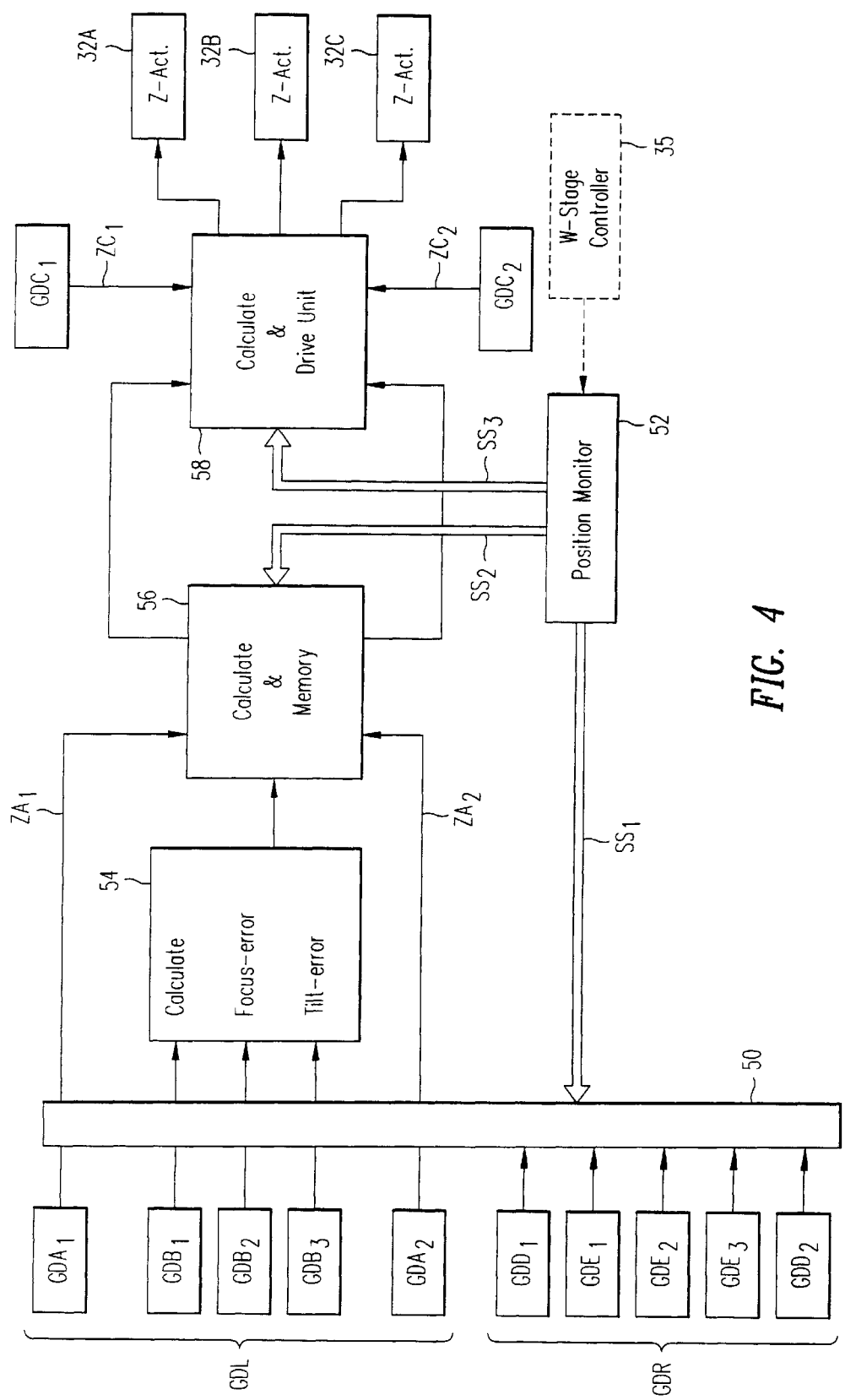
FIG. 4 is a circuit block diagram of a circuit arrangement in the AF control unit shown in FIG. 1.

FIG. 4 is a block diagram of an example of the AF control unit 38 for processing detection signals (error signals) from the focus detection systems GDL, GDR, and GDC shown in FIGS. 1 and 3. As shown in FIG. 4, one of the group of detection signals from the five detectors GDA1, GDA2, GDB1, GDB2, and GDB3 of the pre-reading focus detection systems GDL and the group of detection signals from the five detectors GDD1, GDD2, GDE1, GDE2, and GDE3 of the focus detection systems GDR are selected by a changeover circuit 50 to be supplied to subsequent processing circuits.

The changeover circuit 50 selects the signals from one of the focus detection systems GDL and GDR in response to a changeover signal SS1 (representing a direction discrimination result) supplied from a position monitor circuit 52 which discriminates one scanning movement direction of the wafer stage 34 from the other on the basis of stage control information from the wafer stage controller 35, and which monitors changes in the moved position of the wafer W from the pre-read position to the exposure position. In the state shown in FIG. 4, the changeover circuit 50 is selecting the five detection signals from the focus detection system GDL.

The detection signals from the pre-reading detectors GDB1, GDB2, and GDB3 with respect to the exposure area (projected image SI) are supplied to a first calculator 54 for calculating a focus error amount and a tilt error amount. The calculator 54 supplies a second calculation and memory circuit 56 with error data DT1 and DT2 on focus error amount $\Delta Zf$ and tilt error amount $\Delta Tx$ (fine inclination about the Y-axis) of the surface area of the wafer W previously read at the three detection points FB1, FB2, and FB3.

On the other hand, the detectors GDA1 and GDA2 supplies the second calculation and memory circuit 56 with information ZA1 and information ZA2 representing the surface height positions (or focus deviations) at the detection points FA1 and FA2 simultaneously with the detection of the wafer surface by the three detectors GDB1, GBD2, and GDB3.

The second calculation and memory circuit 56 calculates, on the basis of error data DT1, DT2, information ZA1, ZA2 and the relative positional relationship between the detectors, target values $\Delta Z1$ and $\Delta Z2$ of the height position of the wafer W which should be detected at the detection points FC1 and FC2 of the detectors GDC1 and GDC2 set at the projection exposure position with respect to the Y-direction (scanning direction). The second calculation and memory circuit 56 temporarily stores the calculated target values $\Delta Z1$ and $\Delta Z2$.

The meaning of the target values $\Delta Z1$ and $\Delta Z2$ is that, if information ZC1 and information ZC2 detected by the detectors GDC1 and GDC2 when the surface portions of the wafer W (or auxiliary plate portion HRS) previously read at the pre-reading detection points FA1 and FA2 reach the detection points FC1 and FC2 corresponding to the exposure position are equal to the target values $\Delta Z1$ and $\Delta Z2$, respectively, both the focus error amount $\Delta Zf$ and tilt error amount $\Delta Tx$ determined by pre-reading become zero at the exposure position.

Further, the second calculation and memory circuit 56 outputs the stored target values $\Delta Z1$ and $\Delta Z2$ to a third calculation and drive circuit 58 immediately before the pre-read area on the wafer with respect to the Y-direction arrives at the exposure position at which the projected image SI is exposed.

Accordingly, in synchronization with a signal SS2 output from the position monitor circuit 52, the second calculation and memory circuit 56 outputs signals representing target values $\Delta Z1$ and $\Delta Z2$ temporarily stored to the third calculation and drive circuit 58 after delaying the signals by an amount of time determined by the distance between the straight line LLa and the extension line LLc in the Y-direction and the speed of movement of the wafer W.

If signal SS2 is output each time the wafer W is moved to be scanned through a distance corresponding to the width of the projected image SI in the scanning direction, a certain number of sets of target values $\Delta Z1$ and $\Delta Z2$ (e.g., five sets) corresponding to a number obtained by dividing the distance between the straight line LLa and the extension line LLc in the Y-direction (e.g., about 40 mm) shown in FIG. 3 by the width of the projected image SI (e.g., about 8 mm) are temporarily stored in the second calculation and memory circuit 56. Accordingly, the second calculation and memory circuit 56 functions as a memory for storing target values $\Delta Z1$ and $\Delta Z2$ in a first in-first out (FIFO) manner.

The third calculation and drive circuit 58 reads, in response to a signal SS3 from the position monitor circuit 52, detection information ZC1 and ZC2 on the height position of the surface of the wafer W (or auxiliary plate portion HRS) detected by the detectors GDC1 and GDC2 immediately before the area on the wafer W detected at the pre-read position reaches the exposure position (the position of the projected image SI).

Simultaneously, the third calculation and drive circuit 58 reads the data of target values $\Delta Z1$ and $\Delta Z2$ (corresponding to the exposure position) output from the second calculation and memory circuit 56, determines, by calculation, drive amounts (amounts of position adjustment or amounts of speed adjustment) corresponding to the Z-drive motors 32A, 32B, and 32C shown in FIG. 1 on the basis of information ZC1 and ZC2 and target values $\Delta Z1$ and $\Delta Z2$, and outputs determined drive amount data to the Z-drive motors 32A, 32B, and 32C.

It is to be understood that most of the element of FIG. 4 may be embodied in a programmed microcontroller or microprocessor, executing a suitable program which could be written by one of ordinary skill in the art in light of FIG. 4.

Figure 5:
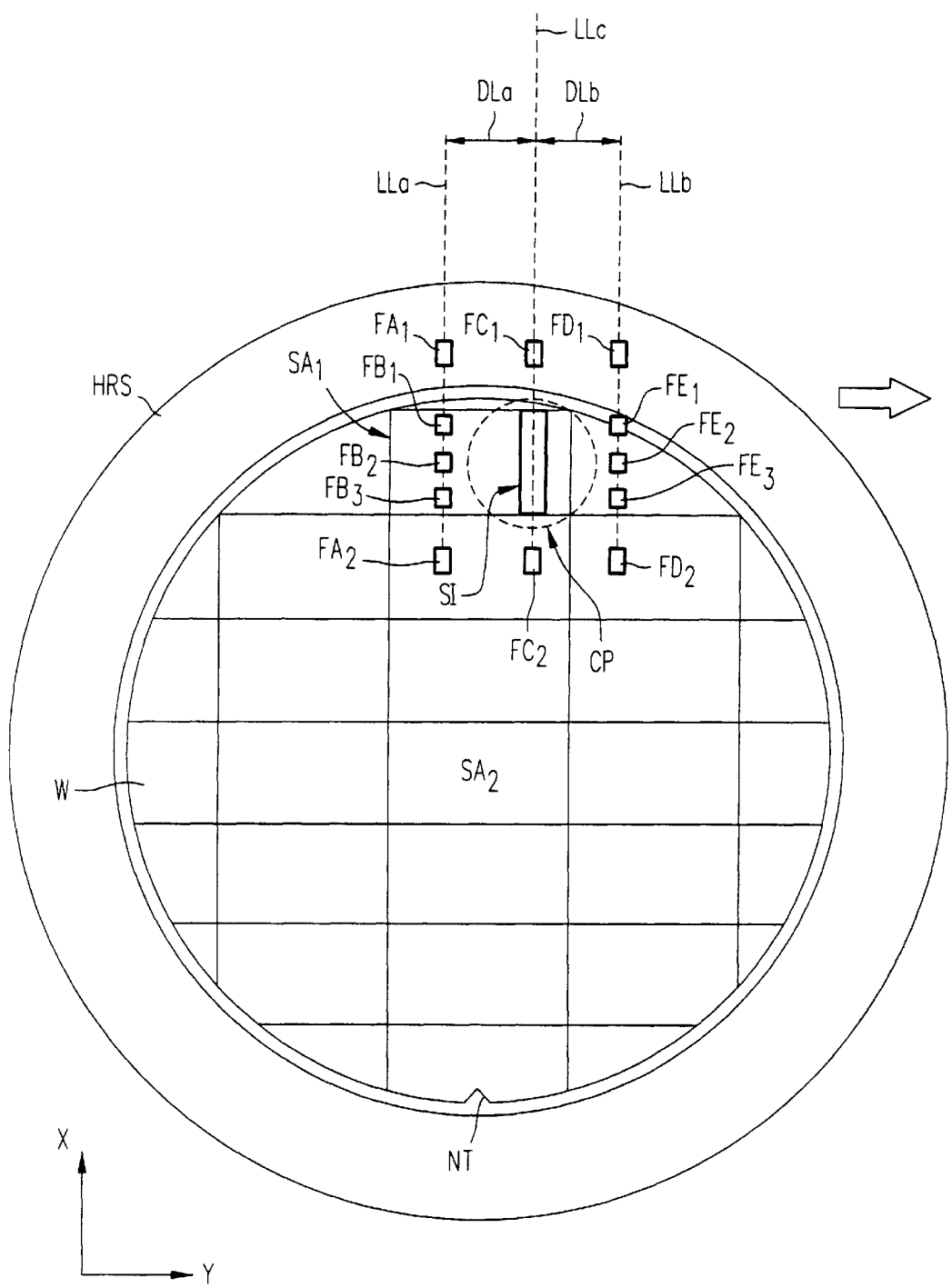
FIG. 5 is a plan view of the positional relationship between a projection field and detection areas of focus sensors on the wafer in the apparatus shown in FIG. 1.

FIG. 5 is a plan view explaining the function of the auxiliary plate portion HRS formed at the peripheral portion of the wafer holder WH as shown in FIG. 1. In this embodiment, since all the detection points of the focus detection systems are positioned outside the projection field CP of the projection lens PL as described above, there is a possibility of some of the focus detection points being located outside the perimeter of wafer W at the time of scanning exposure of some of a plurality of shot areas SAn on the wafer arranged at the peripheral portion of the wafer W.

For example, as shown in FIG. 5, when a peripheral shot area SA1 of the wafer W positioned on the holder WH by using a prealignment notch NT is scanned and exposed, the end focus detection point FA1 (or FD1) of the pre-reading focus detection system GDL (or GDR) and the detection point FC1 of the exposure position focus detection system GDC are located outside the wafer W. In this state, it is difficult to normally perform focusing and tilt adjustment.

A main function of the auxiliary plate portion HRS is enabling normal focusing and tiling in such a situation. As shown in FIG. 5, the detection point FA1 (or FD1) and the detection point FC1 located outside the of the wafer W are set so as to be positioned on the surface of the auxiliary plate portion HRS. Accordingly, it is desirable that the height of the surface of the auxiliary plate portion HRS is substantially equal to that of the surface of the wafer W.

More specifically, the surface of the wafer W and the surface of the auxiliary plate portion HRS are made flush with each other within the detection ranges which correspond to the detection points FA1 (FA2), FC1 (FC2), and FD1 (FD2) and in which the desired linearity of the focus detectors corresponding to the detection points are ensured. Further, since the surface of the auxiliary plate portion HRS is used as an alternative to the surface of the wafer W, its reflectivity is set on the same order or to the same value as the reflectivity of a standard (silicon) wafer. For example, a mirror-finished surface is preferred as the auxiliary plate portion HRS.

If the wafer W (on wafer holder WH) is moved to be scanned in the direction of the arrow shown in FIG. 5, the detection points FA1, FA2; FB1, FB2, FB3 of the focus detection system GDL are selected as pre-reading sensors with respect to the shot area SA1. In this event, if the distance between the extension line LLc corresponding to the center of the projected image SI in the Y-direction and the straight line LLa on which the detection points of the focus detection system GDL are disposed is DLa and if the distance between the extension line LLc and the straight line LLb on which the detection points of the other focus detection system GDR are disposed is DLb, DLa and DLb are set so that DLa is approximately equal to DLb in this embodiment. From the speed Vw of the wafer W at the time of scanning exposure, the delay time $\Delta t$ taken for the focus pre-read position on the wafer W to reach the exposure position is $\Delta t = DLa/Vw$ (sec.). Accordingly, the time for temporary storage of target value data $\Delta Z1$ and $\Delta Z2$ in the second calculation and memory circuit 56 shown in FIG. 4 is substantially equal to the time lag $\Delta t$.

However, the distance DLa and the distance DLb may be selected so that DLa does not equal DLb according to a restriction relating the construction of the aligner. Needless to say, in such a case, the delay time of supply of the target values $\Delta Z1$ and $\Delta Z2$ are set to different lengths with respect to use of the pre-reading focus detection system GDL and use of the focus detection system GDR.

Figure 6A:
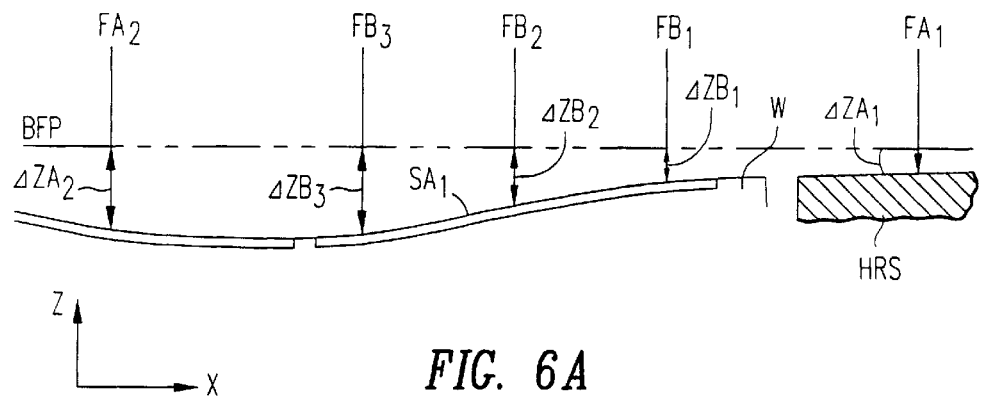
FIGS. 6A, 6B, 6C, and 6D are diagrams of the focusing and tilting operation of the apparatus shown in FIG. 1.

The focusing and tilting operations of the first embodiment arranged as described above is now described with reference to FIGS. 6A through 6D. FIG. 6A schematically shows a state of the upper surfaces of the wafer W and the auxiliary plate portion HRS detected by the pre-reading focus detection system GDL at an instant during scanning exposure of the peripheral shot area SA1 of the wafer W as shown in FIG. 5.

In FIGS. 6A through 6D, a horizontal line BFP represents the optimum focus plane of the projection lens PL. The detector GDB1 that detects the position of the wafer surface in the Z-direction at the focus detection point FB1 in the shot area SA1 outputs a detection signal representing $\Delta ZB1$ as a Z-position error (amount of defocusing) of the wafer surface with respect to the plane BFP. Similarly, the detectors GDB2 and GDB3 that detect errors of the position of the wafer surface in the Z-direction at the focus detection points FB2 and FB3 output detection signals representing errors $\Delta ZB2$ and $\Delta ZB3$. Each of these Z-position errors has a negative value if the wafer surface is lower than the best focus plane BFP, or has a positive value if the wafer surface is higher than the best focus plane BFP.

Figure 6B:
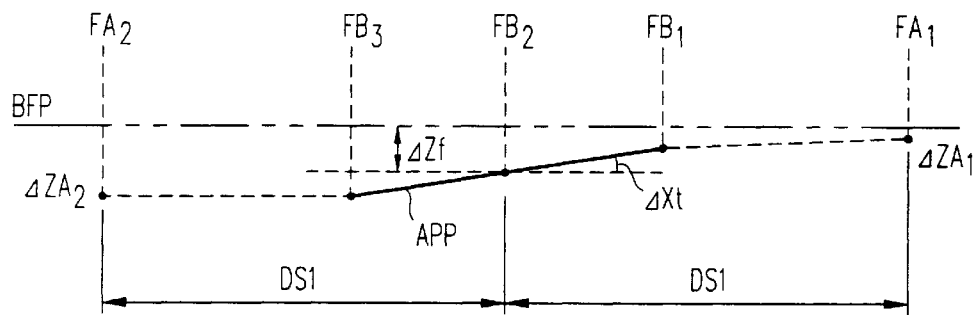

The values of these errors $\Delta ZB1$, $\Delta ZB2$, and $\Delta ZB3$ are input to the first calculation and memory circuit 54 shown in FIG. 4. The first calculation and memory circuit 54 determines parameters of an equation representing an approximate plane APP (actually an approximate straight line) shown in FIG. 6B of the entirety of the pre-read portion in the shot area SA1 by the method of least squares or the like on the basis of these error values. The parameters thereby determined are focus error amount $\Delta Zf$ and tilt error amount $\Delta Tx$ of the approximate plane APP, as shown in FIG. 6B. The values of error amount $\Delta Zf$ and amount $\Delta Tx$ thus calculated are output as data DT1 and DT2 to the second calculation and memory circuit 56. In this embodiment, the focus error amount $\Delta Zf$ is calculated as an error substantially at the middle point (corresponding to detection point FB2) of the shot area SA1 in the X-direction.

When the detectors GDB1, GDB2, and GDB3 detect Z-position errors as described above, the detectors GDA1 and GDA2 simultaneously detect Z-position errors $\Delta ZA1$ and $\Delta ZA2$ of the wafer surface or the surface of the auxiliary plate portion HRS with respect to the best focus plane at the detection points FA1 and FA2. These errors $\Delta ZA1$, $\Delta ZA2$ are temporarily stored in the second calculation and memory circuit 56.

Figure 6C:
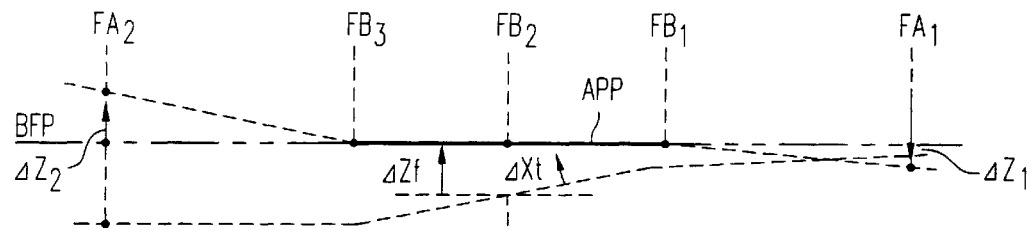

Immediately after this detection and storage, assuming that the approximate plane APP such as that shown in FIG. 6B is corrected so as to coincide with the best focus plane BFP as shown in FIG. 6C, that is, the wafer holder WH is adjusted in the Z-direction and the tilting direction so that $\Delta Zf=0$ and $\Delta Tx=0$, the second calculation and memory circuit 56 calculates the Z-position target value $\Delta Z1$ to be detected at the detection point FA1 and the Z-position target value $\Delta Z2$ to be detected at the detection point FA2 on the basis of data DT1 and DT2 (error amount $\Delta Zf$ and $\Delta Tx$), Z-position errors $\Delta ZA1$, $\Delta ZA2$ actually measured at the detection points FA1 and FA2 and the distance DS between the middle point of the shot area and each of the detection points FA1 and FA2 in the X-direction. The calculated Z-position target values $\Delta Z1$ and $\Delta Z2$ are temporarily stored in the second calculation and memory circuit 56 until the pre-read area on the wafer W reaches the area of the projected image SI (exposure position).

Figure 6D:
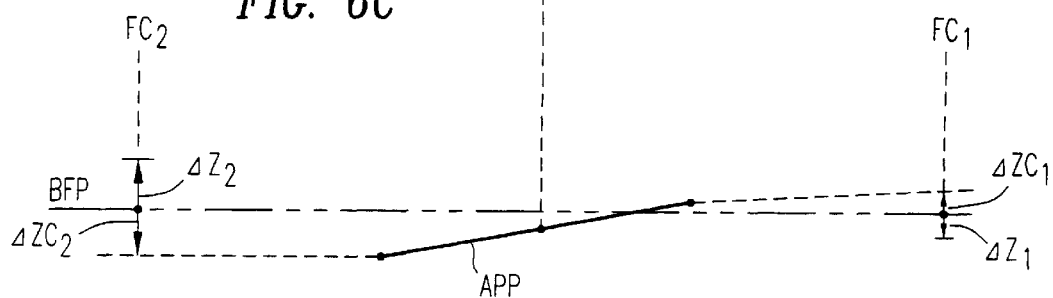

When the pre-read area on the wafer W reaches the exposure position, the third calculation and drive circuit 58 shown in FIG. 4 reads the detection signals from the focus detectors GDC1 and GDC2 for detecting Z-position errors at the detection points FC1 and FC2. If, for example, the pre-read area on the wafer W is in a state such as shown in FIG. 6D immediately before it reaches the exposure position, the detector GDC1 outputs detection signal ZC1 representing a Z-position error at the detection point FC1 while the detector GDC2 outputs detection signal ZC2 representing a Z-position error at the detection point FC2.

Then the third calculation and drive circuit 58 calculates the drive amounts for the three Z-actuators 32A, 32B, and 32C necessary for tilting the wafer holder WH and/or translating the wafer holder WH in the Z-direction so that the values of detection signals ZC1 and ZC2 supplied from the detectors GDC1 and GDC2 become respectively equal to the Z-position target values $\Delta Z1$ and $\Delta Z2$ which are supplied from the second calculation and memory circuit 56 by being delayed. The third calculation and drive circuit 58 supplies the Z-actuators 32A, 32B, 32C with signals corresponding to the calculated drive amounts.

The shot area SA1 of the upper surface of wafer W is thereby precisely adjusted to coincide with the best focus plane BFP at the exposure position. As a result, the projected image SI of the pattern of the reticle R to be maintained in an optimal imaged state is exposed in the scanning mode of the shot area.

For this operation in the first embodiment, each detector in the pre-reading focus detection system GDL and each detector in the exposure position focus detection system GDC are set (calibrated) so as to output a detection signal indicating that there is no focus error when the surfaces of the wafer W or the auxiliary plate portion HRS coincide with the best focus plane BFP. However, it is difficult to strictly set the detectors in such a state. In particular, a detection offset between the detectors GDA1 and GDA2 (GDD1 and GDD2) in the pre-reading focus detection system GDL (GDR) and the exposure position focus detectors GDC1 and GDC2 steadily defocuses the pattern image formed on the wafer W for exposure.

Therefore, an offset value between the height position in the Z-direction at which the detector GDC1 detects the zero focus error and the height position in the Z-direction at which the detector GDA1 (GDD1) detects the zero focus error may be measured and stored by simultaneously performing focus detection by these detectors on the extremely high flatness surface of a reflective glass plate (or fiducial plate) provided on the wafer holder WH. This surface may be structure HRS or another structure separate from structure HRS. As a result, the correction by the stored offset value may be made when the Z-actuators 32A, 32B, and 32C are drive on the basis of the Z-position errors detected by the exposure position focus detectors GDC1 and GDC2.

The construction of a focus and tilt sensor in accordance with a second embodiment of the present invention is next described with reference to FIGS. 7A and 7B. With respect to the second embodiment, a situation is supposed in which the projected image SI contained in the circular field of the projection lens PL has a comparatively large maximum width in the Y-direction (scanning direction) such that the influence of a tilt of the surface of wafer W in the Y-direction, i.e., pitching, is considerable.

Figure 7A:
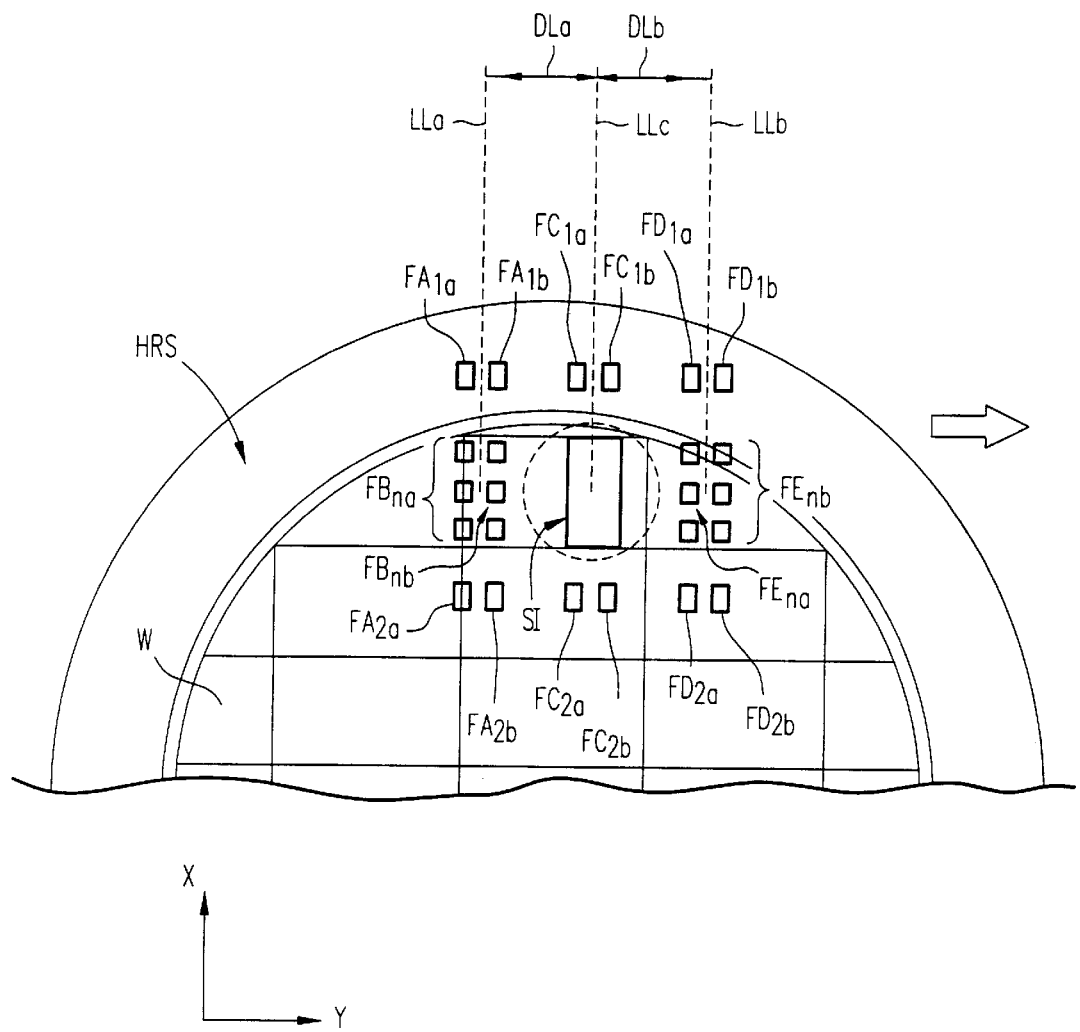
FIG. 7A is a plan view of a layout of detection areas of a focus/tilt detection system in a second embodiment of the present invention.

As shown in FIG. 7A, an exposure position focus detector GDC1 (not illustrated) is provided which has two detection points FC1$a$ and FC1$b$ disposed symmetrically about extension line LLc in the Y-direction above the projected image SI, and another exposure position focus detector GDC2 (not illustrated) is provided which has two detection points FC2$a$ and FC2$b$ disposed symmetrically about extension line LLc in the Y-direction below the projected image SI. Further, a pre-reading focus detector GDA1 having two detection points FA1$a$ and FA1$b$ disposed symmetrically about straight line LLa in the Y-direction and a pre-reading focus detector GDA2 (not illustrated) having two detection points FA2$a$ and FA2$b$ disposed symmetrically about straight line LLa in the Y-direction are provided. Similarly, a pre-reading focus detector GDD1 (not illustrated) having two detection points FD1$a$ and FD1$b$ disposed symmetrically about straight line LLb in the Y-direction and a pre-reading focus detector GDD2 having two detection points FD2$a$ and FD2$b$ disposed symmetrically about straight line LLb in the Y-direction are provided.

Pre-reading focus detectors GDBn (n=1, 2, 3) (not illustrated) having pairs of detection points FB1$a$, FB1$b$; FB2$a$, FB2$b$; FB3$a$, FB3$b$, and pre-reading focus detectors GDEn (n=1, 2, 3) (not illustrated) having pairs of detection points FE1$a$, FE1$b$; FE2$a$, FE2$b$; FE3$a$, FE3$b$ are also provided. Each pair of detection points are spaced apart from each other in the Y-direction.

The focus detection system shown in FIG. 7A reproduces adjustment amounts (i.e., target values $\Delta Z1$ and $\Delta Z2$) necessary for correcting the pre-read surface configuration (i.e., error amount $\Delta Zf$ and $\Delta Tx$) of each shot area at the detection points of the off-axis detectors GDC1 and GDC2 in the same manner as the above-described first embodiment, thereby enabling focus adjustment in the Z-direction and tilt adjustment in the X-direction (rolling direction) of the exposure area.

In this embodiment, since the pre-reading focus detection system GDL (GDR) and the exposure position focus detection system GDC have pairs of detection points (FAn$a$ and FAn$b$; Fbn$a$ and FBn$b$; FCn$a$ and FCn$b$; FDn$a$ and FDn$b$; FEn$a$ and FEn$b$) spaced apart by a certain distance in the Y-direction, a tilt error amount $\Delta Ty$ of the pre-read shot area in the pitching direction can be detected from the differences between Z-position errors at the detection points ( . . . n$a$, . . . n$b$) forming pairs in the Y-direction, and adjustment amounts (i.e., target values $\Delta ZA1$, $\Delta ZA2$) necessary for correcting the surface configuration of the shot area including of the tilt error amount $\Delta Ty$, can be reproduced at the detection points (FCn$a$ and FCn$b$) of the off-axis detectors GDC1 and GDC2.

The detectors GDB1, GDB2, and GDB3 for detecting the focus positions at the detection positions FB1, FB2, and FB3 shown in FIG. 3 are disposed as systems independent of each other by being fixed to a lower portion of the projection lens PL. However, at least these three detectors GDB1, GDB2, and GDB3 may be arranged to detect the focus positions at the detection points FB1, FB2, and FB3 through a common objective lens system. The same can also be said with respect to the group of three detectors GDE1, GDE2, and GDE3 for detecting the focus positions at the detection points FE1, FE2, and FE3 shown in FIG. 5.

Further, a common objective lens system may be used for the same purpose with respect to the group of six detectors for detecting the focus positions at the six detection points Fbn$a$ and FBn$b$ (n=1, 2, 3) shown in FIG. 7A or the other group of six detectors for detecting the focus positions at the six detection points FEn$a$ and FEn$b$ (n=1, 2, 3). An arrangement of using a common objective lens system for detectors for detecting the focus positions at a plurality of detection points is therefore described briefly with reference to FIG. 7B.

Figure 7B:
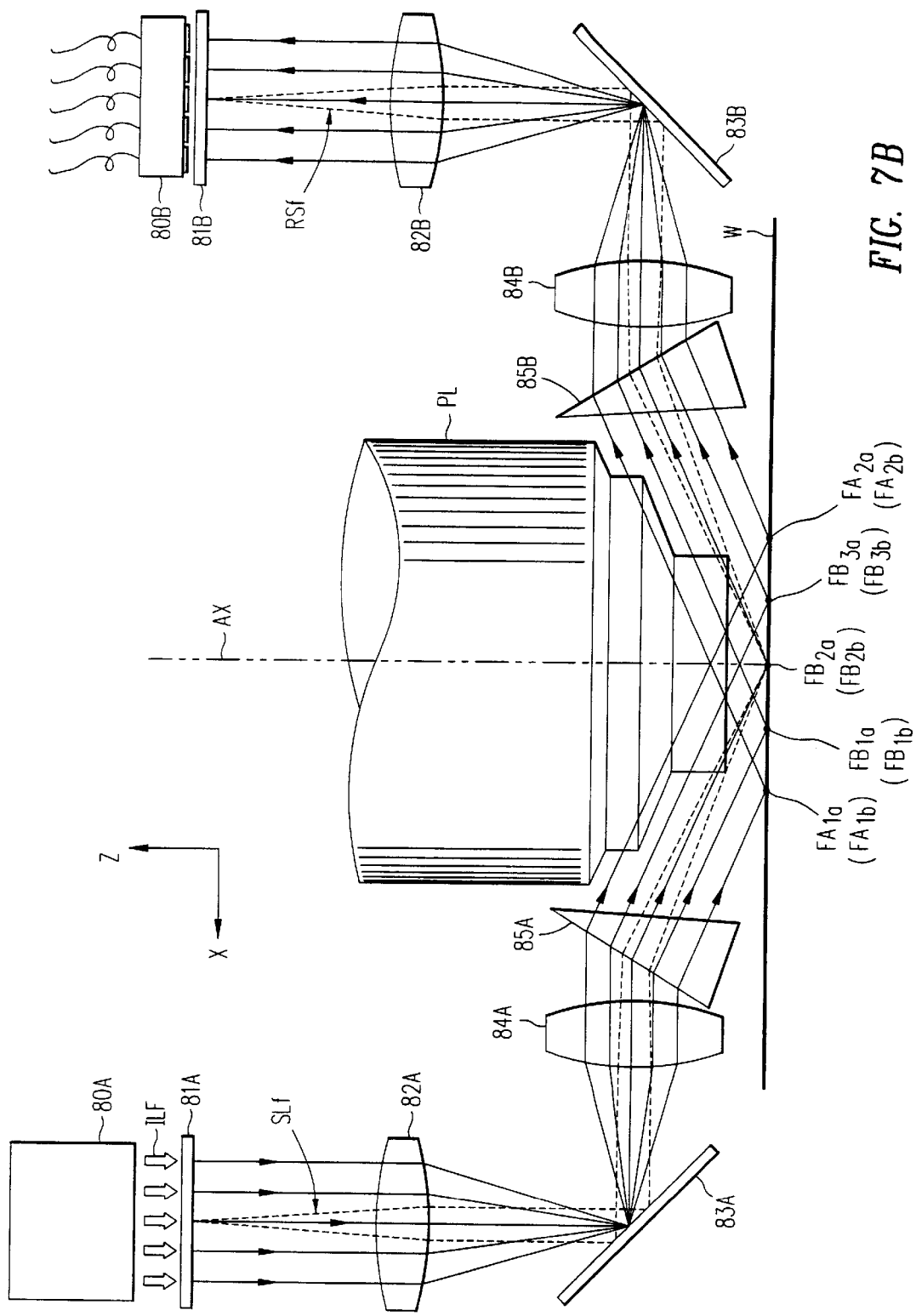
FIG. 7B is a side view of a layout of a modified example of the focus/tilt detection system shown in FIG. 7A.

FIG. 7B is a schematic side view of the positional relationship between the projection lens and the detectors corresponding to the six detection points FBn$a$ and FBn$b$ (n=1, 2, 3) and the four detection points FA1$a$, FA1$b$, FA2$a$, and FA2$b$ shown in FIG. 7A as seen in the Y-direction in FIG. 7A. Accordingly, the scanning direction of the wafer W in FIG. 7B is a direction perpendicular to the plane of the figure and the five detection points FA1$a$, FBn$a$ (n=1, 2, 3), and FA2$a$ arranged in a row in the X direction at the leftmost position in FIG. 7A are representatively shown in FIG. 7B. Another row of detection points FA1b, FBnb (n=1, 2, 3), and FA2b are adjacent to the five detection points FA1a, FBna (n=1, 2, 3), and FA2a (in a direction perpendicular to paper of FIG. 7B). In this embodiment, the focus positions at these ten points are detected through the objective lens system.

As shown in FIG. 7B, illumination light ILF from an illumination optical system 80A including a light source (e.g. a light emitting diode, a laser diode, a halogen lamp or the like) capable of emitting light in a wavelength range to which the resist layer on wafer W is not sensitive is emitted through each of ten small slits formed in a multi-slit plate 81A. The ten small slits are disposed in correspondence with the ten detection points FBna, FBnb (n=1, 2, 3), FA1a, FA1b, FA2a, and FA2b set on the wafer W. Light transmitted through the small slits is incident upon an objective lens 84A of a projection system via a lens system 82A and a reflecting mirror 83A and is deflected by a prism 85A by a desired angle to form a slit image at each detection point.

The illumination optical system 80A, the multi-slit plate 81A, the lens system 82A, the reflecting mirror 83A, the objective lens 84A and the prism 85A constitute a projection system of an oblique incident light type focus detection unit. The solid lines in the optical path from the multi-slit plate 81A to the wafer W shown in FIG. 7B represent principal rays of transmitted light from the small slits, and the broken lines in the optical path represent typical imaging rays Slf of the small slit imaging light imaged at the detection point FB2a (or FB2b).

The reflected light of the small slit imaging light reflected at each detection point on the wafer W is again imaged on a receiving slit plate 81B via a prism 85B, an objective lens 84B, a reflecting mirror 83B and a lens system 82B disposed generally symmetrically with respect to the projection system. Ten small receiving slits disposed in correspondence with the small slits in the projection multi-slit plate 81A are formed in the receiving slit plate 81B. Light transmitted through these receiving slits is received by a light receiving device 80B which is a plurality of photoelectric detection elements.

As the photoelectric detection elements of the light receiving device 80B, ten photoelectric detection elements are provided in correspondence with the positions of the small slits of the receiving slit plate 81B to separately detect the focus positions at the detection points on the wafer. The light receiving device 80B, the receiving slit plate 81B, the lens system 82B, the reflecting mirror 83B, the objective lens 84B and the prism 85B constitute a light receiving system of the oblique incident light type focus detection unit. The solid lines in the optical path from the wafer W to the receiving slit plate 81B shown in FIG. 7B represent principal rays of the small slit images normally reflected by the wafer W, and the broken lines in the optical path represent typical imaging rays RSf from the detection point FB2a (or FB2b) to the receiving slit plate 81B.

The projection system and the receiving system shown in FIG. 7B are mounted on an integrally-formed metal member so that the positions of the components are accurately maintained relative to each other. The metal member is rigidly fixed on the lens barrel of the projection lens PL. Another focus detection unit constructed in the same manner is disposed on the opposite side of the projection lens PL to separately detect the focus positions at the ten detection points FEna, FEnb (n=1, 2, 3), FD1a, FD2a, FD1b, and FD2b shown in FIG. 7A.

With respect to the pair of detection points FC1a and FC1b and the pair of detection points FC2a and FC2b shown in FIG. 7A, oblique incident light type focus detection units each having a projection system and a receiving system arranged in the Y-direction of FIG. 7A (direction perpendicular to paper in FIG. 7B) may be provided on the opposite sides of the projection lens PL in the X-direction. Also in the case where the focus position detection points are disposed as shown in FIG. 5, the oblique incident light type focus detection unit shown in FIG. 7B can also be applied in the same manner.

Figure 8A:
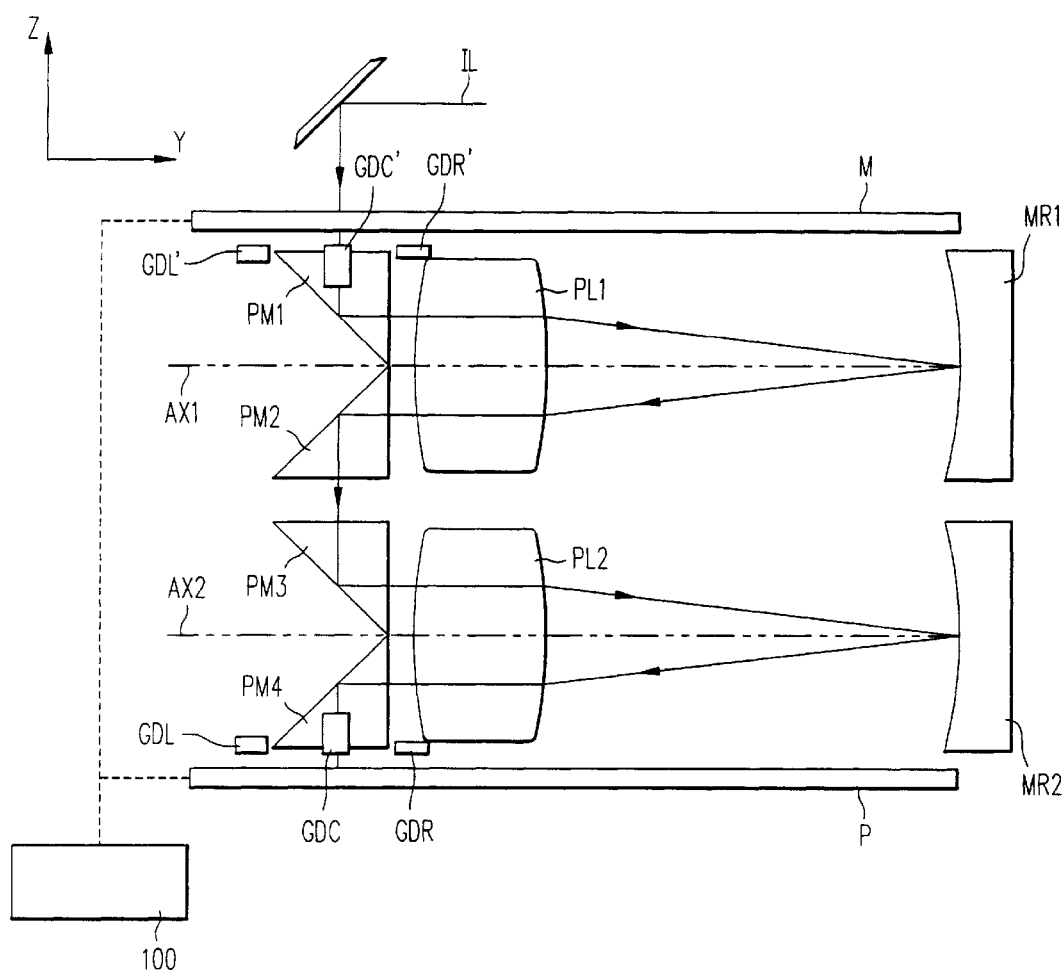
FIG. 8A is a schematic diagram in a third embodiment of the present invention in which the invention is applied to a scanning exposure apparatus (scanning aligner)

A scanning aligner to which the present automatic focusing/tilt control system is applied is next described in accordance with a third embodiment of the present invention with reference to FIG. 8A. This embodiment is applicable to a scanning aligner for a large substrate e.g. 300 mm diameter or greater having a 1× projection optical system formed of a tandem combination of a first-stage Dyson type (catadioptric) projection imaging system consisting of a pair of prism mirrors PM1 and PM2, a lens system PL1 and a concave mirror MR1 and a second-stage Dyson type projection imaging system consisting of a pair of prism mirrors PM3 and PM4, a lens system PL2 and a concave mirror MR2. Such an aligner is disclosed in U.S. Pat. No. 5,298,939 (to Swanson et al.), for example.

In the aligner shown in FIG. 8A, a mask M provided as an original plate and a plate P provided as a photosensitive substrate are integrally supported on a carriage 100, and a pattern on the mask M is transferred onto the plate P as a 1× (unit magnification) erect image by moving the carriage 100 to the left or right as viewed in FIG. 8A relative to the projection field of the 1× projection optical system and illumination light IL so as to scan the mask M and plate P.

In the case of the projection optical system for this type of aligner, it is desirable to minimize the spacing between the incidence plane of the prism mirror PM1 and the surface of the mask M and the spacing between the exit plane of the prism mirror PM4 and the upper surface of the plate P for reducing deteriorations in imaging performance (various aberrations and image distortion). In other words, if these spacings can be sufficiently reduced, the design of the lens systems PL1 and PL2 disposed on the optical axes AX1 and AX2 becomes easier. Therefore, to achieve the desired imaging performance, it is necessary to reduce the spacing between the prism mirror PM1 and the mask M and the spacing between the prism mirrors PM4 and the plate P.

In view of this condition, for focusing and tilt adjustment of the pattern image projected by this projection, prereading focus detection systems GDL and GDR and an exposure position off-axis type focus detection system GDC such as those of the first embodiment (FIG. 3) or the second embodiment (FIGS. 7A, 7B) are provided around the prism mirror PM4 as shown in FIG. 8A to precisely coincide the surface of the plate P and the best focus plane BFP at the exposure position immediately below the prism mirror PM4, by slightly moving the plate P in the Z-direction and the tilting direction.

Further, pre-reading focus detection systems GDL' and GDR' and an exposure position off-axis type focus detection system GDC' may be disposed around the prism mirror PM1 on the mask M side so as to face the mask M, as shown in FIG. 8A. These focus detection systems make it possible to detect a focus error and a tilt error of the area of the mask M irradiated with illumination light IL with respect to the prism mirror PM1 and to measure, in real time, a small deviation in the Z-direction (a focus shift of the image plane) and a tilt deviation (inclination of the image plane) of the best focus plane (i.e., a conjugate plane of reticle R) formed at a predetermined working distance from the prism mirror PM4.

Thus, in the aligner shown in FIG. 8A, the image plane on which the pattern of the mask M is projected and imaged in an optimal condition by the projection optical system and the surface of the plate P can be adjusted to coincide with each other highly accurately during scanning exposure.

Figure 8B:
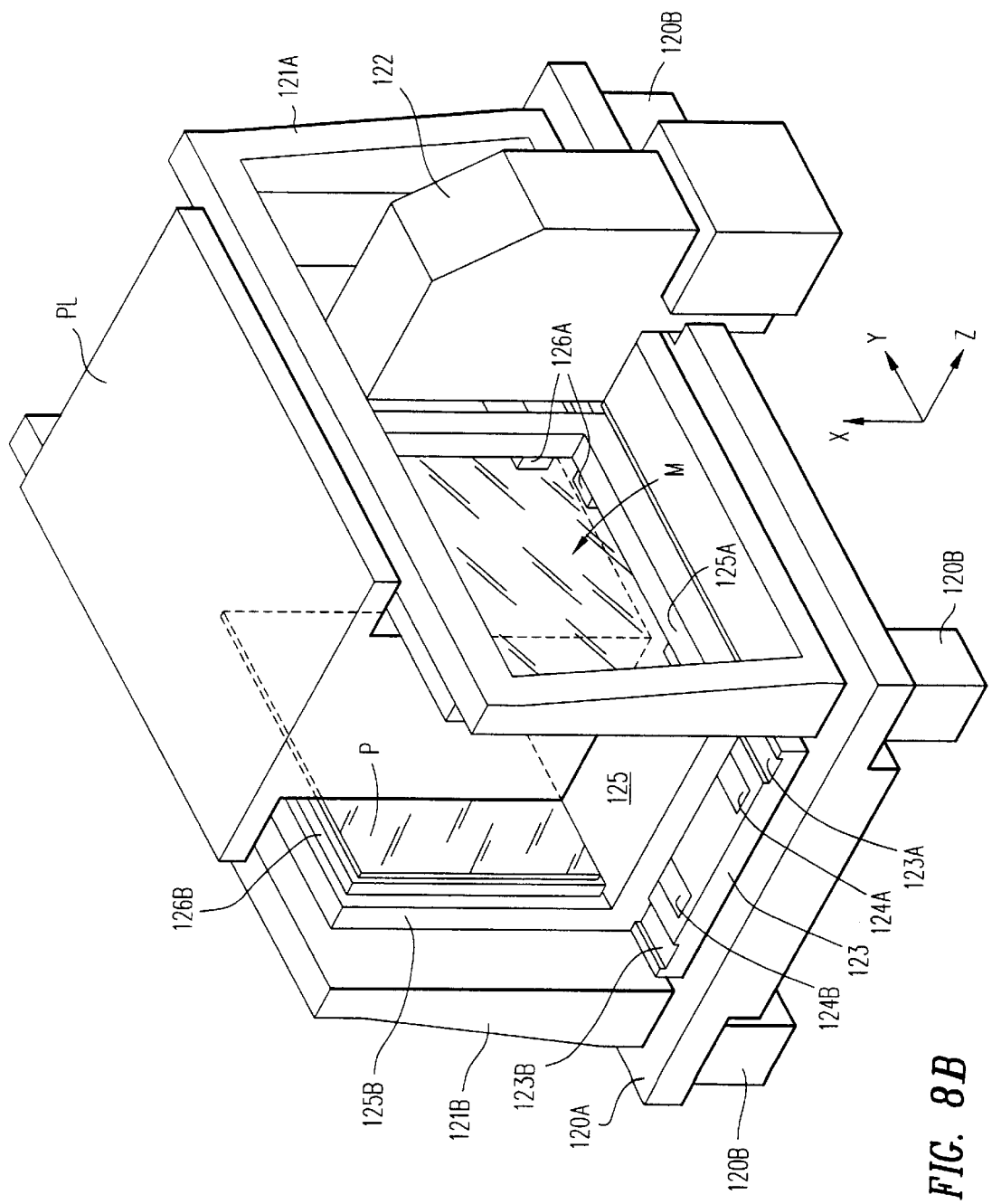
FIG. 8B is a perspective view of a vertical carriage applied to the scanning aligner shown in FIG. 8A.

The aligner shown in FIG. 8A may be constructed so that mask M and plate P stand vertically. FIG. 8B is a perspective view of an exemplary structure of a scanning aligner having a vertical carriage for vertically holding mask M and plate P and for integrally moving mask M and plate P with respect to a projection optical system for scanning. A scanning aligner having mask M and plate P held vertically in this manner is disclosed in Japanese Laid-Open Patent Application No. (Hei) 8-162401, for example.

Referring to FIG. 8B, the entirety of the vertical type scanning aligner is constructed on a fixed base 120A which is placed on a floor with vibration isolators interposed between four corner portions of the fixed base 120A and the floor. Side frame portions 121A and 121B are provided on opposite side portions of the fixed base 120A so as to stand vertically (in the X-direction). A mask M is placed inside the side frame portion 121A while a plate P is placed inside the side frame portion 121B. In the side frame portion 121A, there-fore, an opening is formed in which an end portion of an illumination unit 122 having optical systems for illuminating mask M with exposure illumination light and for mask-plate alignment is inserted, as illustrated.

A guide base portion 123 is provided on the fixed base 120A so as to extend in the scanning direction (Y-direction) between the side frame portions 121A and 121B. Two straight guide rails 123A and 123B are formed on the guide base portion 123 so as to extend in the Y-direction parallel to each other. A vertical carriage 125 is supported by fluid bearings or magnetic floating bearings on the guide rails 123A and 123B reciprocatingly movably in the Y-direction. The vertical carriage 125 is driven in the Y-direction in a non-contact manner by two parallel linear motors 124A and 124B having stators fixed on the guide base portion 123.

The vertical carriage 125 has a mask-side carriage portion 125A vertically formed inside the side frame portion 121A to hold mask M and a plate-side carriage portion 125B vertically formed inside the side frame portion 121B to hold plate P. A mask table 126A for slightly moving mask M in the X- or Y-direction in an XY-plane or in a rotational (θ) direction and for slightly moving mask M in the Z-direction while holding mask M is provided on the mask-side carriage portion 125A. On the other hand, a plate stage 126B for slightly moving plate P in the X- or Y-direction in an XY-plane or in a rotational (θ) direction and for slightly moving plate P in the Z-direction while holding plate P is provided on the plate-side carriage portion 125B.

A projection optical system PL such as one disclosed in Japanese Laid-Open Patent Application No. (Hei) 8-162401 mentioned above is used in this embodiment. The projection optical system PL is constructed by arranging a plurality of sets (e.g., seven sets) of "1×" erect type double Dyson systems in the direction perpendicular to the X-direction. The plurality of sets of double Dyson systems are integrally combined and housed in a casing which is generally T-shaped as viewed in an XZ-plane. The projection optical system PL thus constructed is mounted by being suspended from upper end portions of the opposite side frame portions 121A and 121B so that predetermined working distances from mask M and plate P are maintained.

In the entire casing of the projecting optical system PL, mask M-side focus detection systems GDC', GDL', and GDR' on the mask M side and plate P-side focus detection systems GDC, GDL, and GDR are provided so as to face mask M and plate P, respectively, as shown in FIG. 8A. The detection points defined by the pre-reading focus detection systems GDL, GDL', GDR, and GDR' may be set in correspondence with the projection fields of the plurality of sets of double Dyson systems or may be arranged at predetermined intervals irrespective of the placement of the projection fields.

Figure 8C:
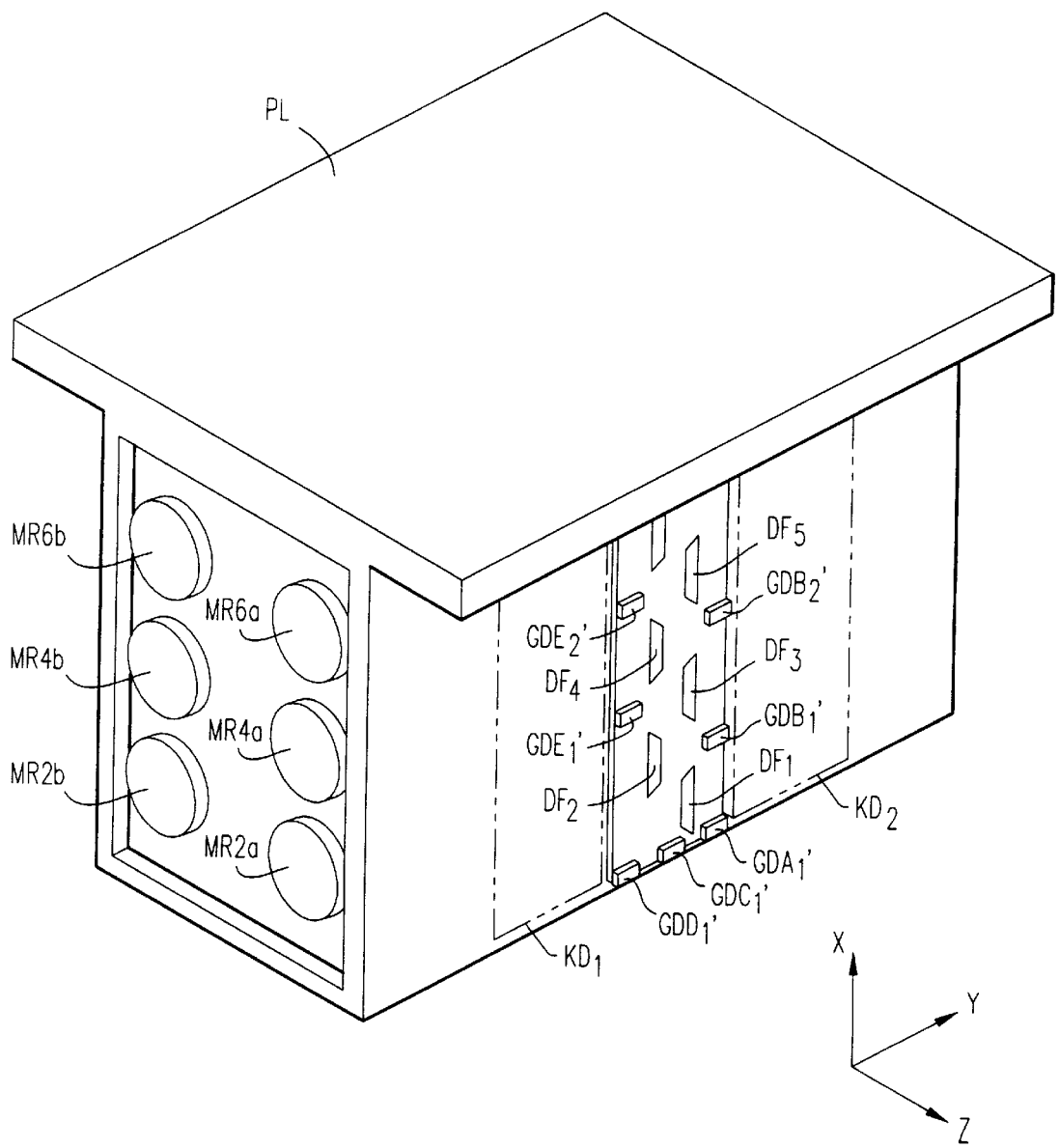
FIG. 8C is a perspective view of a projection optical system and a focus detection system provided in the projection aligner shown in FIG. 8A.

FIG. 8C is a perspective view of an example of a layout of detectors in mask M-side focus detection systems GDC', GDL', and GDR' provided in the casing of the projection optical system PL shown in FIG. 8B. The effective projection fields DF1, DF2, DF3, DF4, DF5, . . . of the plurality of sets of double Dyson systems are set as trapezoidal areas elongated in the X-direction perpendicular to the scanning direction. The trapezoidal projection fields DFn (n=1, 2, 3. . . ) are arranged in such a manner that the trapezoidal projection fields of each adjacent pair of double Dyson systems overlap each other by their oblique sides as seen in the X-direction.

While only the projection fields DFn on the mask M side are illustrated in FIG. 8C, the projection fields on the plate P side are also arranged in the same manner. For example, the projection field DF2 shown in FIG. 8C is defined by a double Dyson system such as that shown in FIG. 8A including two concave mirrors MR2$a$ and MR2$b$, and the projection field DF4 is defined by a double Dyson system including two concave mirrors MR4$a$ and MR4$b$.

As shown in FIG. 8C, detectors GDA1', GDB1', GDB2' . . . , GDA2' (detectors GDA2' not being seen in FIG. 8C) for the pre-reading focus detection system GDL' and detectors GDD1', GDE1', GDE2' . . . , GDD2' (detectors GDD2' not being seen in FIG. 8C) for the pre-reading focus detection system GDR' are disposed on the opposite sides (on the front and rear sides with respect to the scanning direction) of the plurality of projection fields DFn. Also, exposure position focus detectors GDC1' and GDC2' (detector GDC2' not being seen in FIG. 8C) are disposed at the opposite ends of the entire array of the plurality of projection fields DFn in the X-direction perpendicular to the scanning direction.

Each of the focus detectors described above is e.g. an air micrometer type electrostatic gap sensor. They may alternatively be oblique incident light type focus detectors. While only the focus detectors for detection on the mask M side are illustrated in FIG. 8C, a plurality of detectors are also arranged in the same manner in the focus detection systems GDC, GDL, and GDR for detection of the plate P.

Adjustment portions KD1 and KD2 for adjusting various optical characteristics of the plurality of sets of double Dyson systems are provided on side portions of the casing of the projection optical system PL shown in FIG. 8C. Therefore, a mechanism is provided to adjust the Z-direction position, i.e., to set a mechanical (optical) focus offset detected as a best focus plane by each focus detector, if the position of the best focus plane on the mask M side or plate P side is changed in the Z-direction in FIG. 8C by the optical characteristic adjustment.

This mechanism may be e.g. a mechanism which mechanically adjusts the position of a focus detector in the Z direction, or a mechanism which optically adjusts the position recognized as the best focus position by the focus detector in the Z direction, so that the optical path length is changed optically. Alternatively, the mask or plate are automatically adjusted for focussing in the Z direction according to detection signals which represent a focus error, and an offset is added to its moved position in the Z direction.

Figure 9:
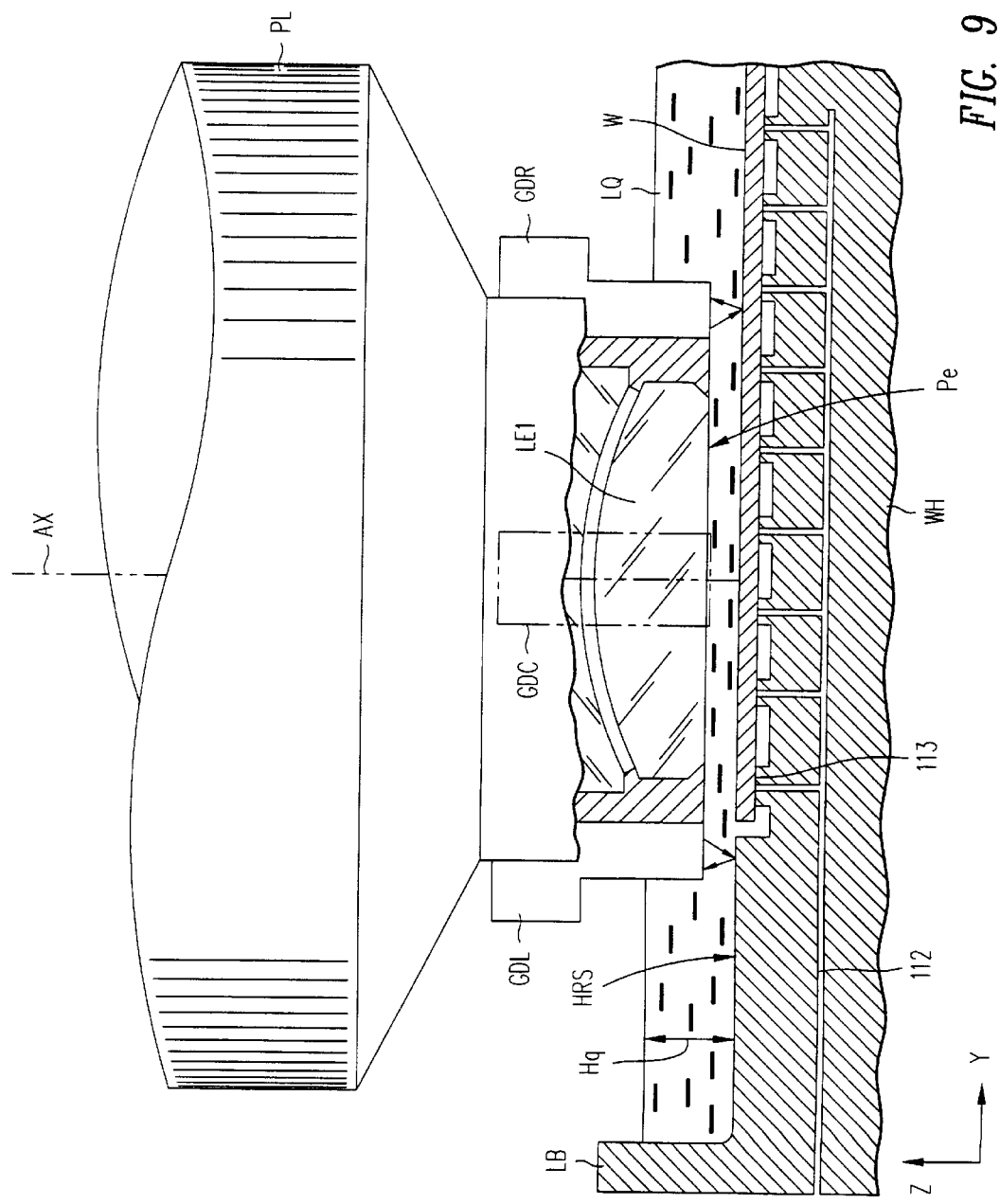
FIG. 9 is a cross-sectional view in a fourth embodiment of the present invention in the construction of which the invention is applied to an immersion projection exposure apparatus.

A fourth embodiment in accordance with the present invention is next described with reference to FIG. 9. This embodiment is applicable to an apparatus for performing projection exposure while immersing a projection end portion of a projection lens system PL in a liquid as described above. FIG. 9 is a cross-sectional view of a portion of the apparatus from the end of the projection lens system PL and to a wafer holder WH.

A positive lens element LE1 having a flat lower surface Pe and a convex upper surface is fixed on the end of the projection lens system PL inside the lens barrel. The lower surface Pe of this lens element LE1 is finished so as to be flush with the end surface of the extreme end of the lens barrel, so that a flow of a liquid LQ is disturbed only to a minimal extent. To a lens barrel end portion of the projection lens system PL immersed in liquid LQ, detectors of pre-reading focus detection systems GDL and GDR and an exposure position focus detection system GRD which are similar to those shown in FIG. 1 are attached so that their extreme end portions are immersed in liquid LQ.

A plurality of attraction surfaces 113 for attracting the reverse surface of wafer W by vacuum suction are formed in a central inner bottom portion of the wafer holder WH. More specifically, the attraction surfaces 113 a plurality of circular-band-like land portions which have a height of about 1 mm and which are formed concentrically with each other with a predetermined pitch in the diametrical direction of the wafer W. Each of the grooves formed in central portions of the circular land portions communicates with a tubing 112 in the wafer holder WH. The piping 112 is connected to a vacuum source for vacuum suction.

In this embodiment, the spacing (substantial working distance) between the lower surface Pe of the lens element LE1 at the end of the projection lens system PL and the upper surface of the wafer W (or auxiliary plate portion HRS) in an optimum focus state, i.e., the thickness of liquid LQ in which a projection optical path is formed, is set to be 5 mm or less. Accordingly, the depth Hq of liquid LQ filling the wafer holder WH may be two to several times larger than this thickness (5 mm or less), and the height of a wall portion LB vertically formed at the peripheral end of the wafer holder WH is about 10 to 25 mm. Thus in this embodiment, the thickness of liquid LQ in the imaging optical path corresponding to the working distance of the projection lens system PL is reduced, so that the total volume of liquid LQ filling the wafer holder WH is smaller and hence temperature control of the liquid [LQ] is easier.

In the region of liquid LQ in which the projection optical path is formed, a part of the illumination energy is absorbed when exposure light passes therethrough, so that an irradiation heat fluctuation can easily occur. If the depth Hq of liquid LQ is small, an increase in temperature due to such irradiation heat fluctuation occurs easily and an adverse effect of reducing the stability of temperature control may result. In such a case, a better effect is obtained by setting the depth Hq of liquid LQ to a value several times the substantial working distance, in order to disperse the influence of irradiation heat fluctuation in the large-volume liquid layer.

To provide focus detection systems GDL, GDR, and GDC as an optical type detection system in an immersion projection system such as that shown in FIG. 9, one prevents the projected beam obliquely incident upon the surface of wafer W or auxiliary plate portion HRS and the beam reflected by this surface from intersecting the interface between liquid LQ and air. An example of a focus/tilt detection system suitable for such an immersion projection type aligner is therefore described with reference to FIG. 10.

Figure 10:
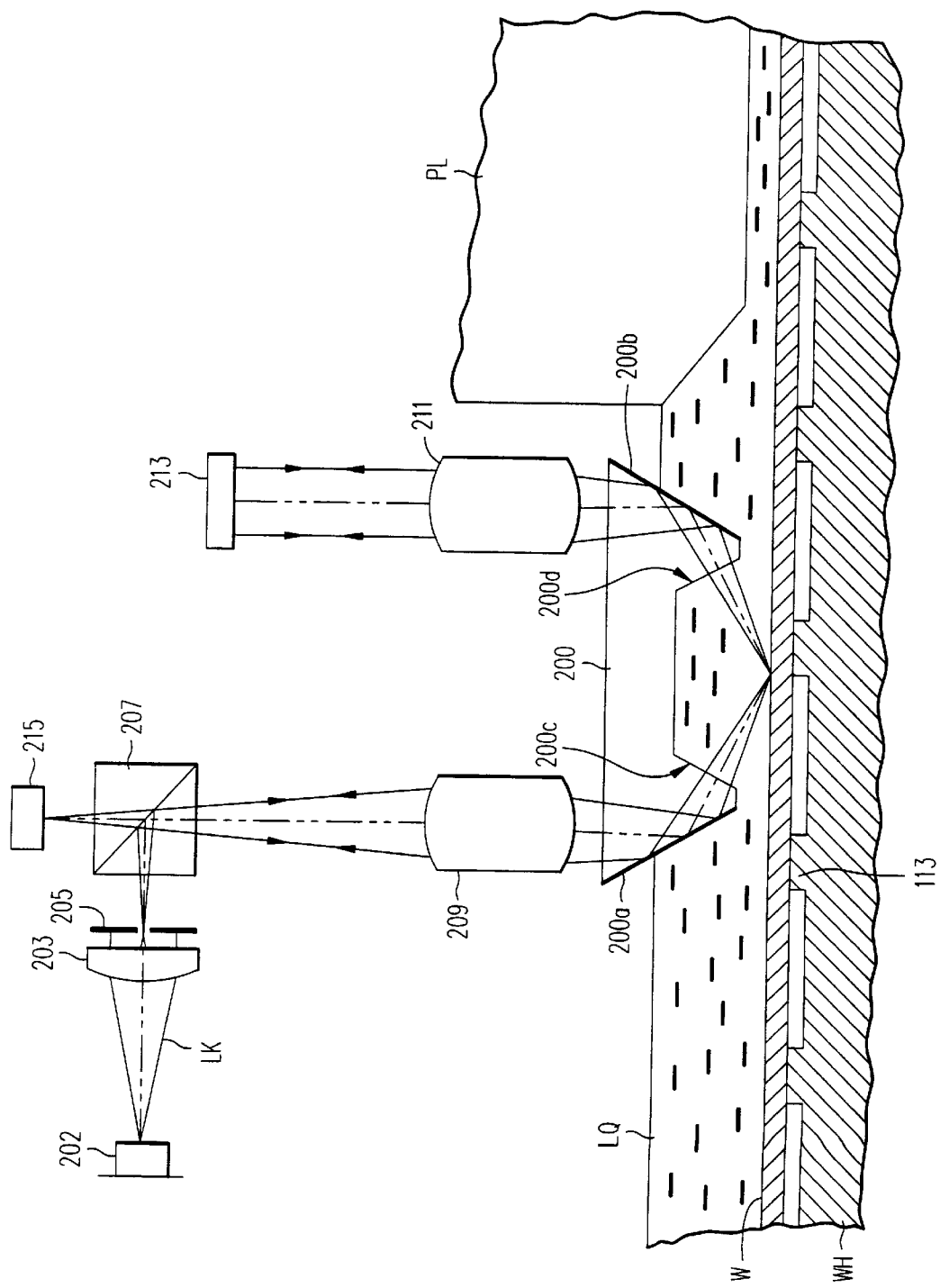
FIG. 10 is a diagram showing an example of an optical path layout of a focus/tilt detection system suitable for the immersion projection exposure apparatus.

FIG. 10 shows the construction of a focus detection system GDL disposed in the vicinity of a projection lens system PL. Other detection systems GDR and GDC are constructed in the same manner as the detection system GDL. In FIG. 10, the same components as those shown in FIG. 9 are indicated by the same reference characters or numerals.

Referring to FIG. 10, a prism mirror 200 formed of a glass block and having a lower portion immersed in liquid LQ is fixed in the vicinity of a peripheral portion of the projection lens system PL. The prism mirror 200 has reflecting surfaces 200a and 200b partially immersed in liquid LQ, and flat surfaces 200c and 200d through which the projected beam or reflected beam travels out of the glass of the prism mirror 200 into liquid LQ or out of liquid LQ into the glass. Also the prism mirror 200 has a flat upper surface.

A multi-slit plate 205 is illuminated through a condenser lens or a cylindrical lens 203 with light LK (having a non-actinic wavelength relative the resist on wafer W) from a light source 202 such as a light emitting diode (LED) or a laser diode (LD) for forming a projected beam for focus/tilt detection. A plurality of transmission slits corresponding to detection points (areas) FAn and FBn of the focus detection system GDL are formed in the slit plate 205. The light from each transmission slit is reflected by a beam splitter 207 and is incident upon an objective lens 209 to be converged as an imaging beam forming a slit image on the upper surface of wafer W.

The imaging beam emergent from the objective lens 209 enters the prism mirror 200 through the upper end surface of the same, is normally reflected by the reflecting surface 200a, and enters liquid LQ through the flat surface 200c to be obliquely incident upon the surface of wafer w to irradiate the same. The beam reflected by wafer W enters the prism mirror 200 through the opposite flat surface 200d, is normally reflected by the reflecting surface 200b and travels out of the prism mirror 200 through the upper end surface. This reflected light beam passes through an objective lens 211 and is reflected by a reflecting mirror 213 disposed at a pupil position of the objective lens 211.

The beam reflected by the mirror 213 travels reversely through the objective lens 211 and again travels via the reflecting surface 200 and the flat surface 200d of the prism mirror 200 to again irradiate wafer W. The light beam again reflected by wafer W travels via the flat surface 200c and the reflecting surface 200a of the prism mirror 200, passes the beam splitter 207 and is incident on a photoelectric detector 215. The photoelectric detector 215 is a plurality of light receiving elements corresponding to the slits of the slit plate 205. The photoelectric detector 215 separately outputs detection signals with respect to the detection points FAn and FBn, respectively.

Thus, the focus/tilt detection system shown in FIG. 10, is arranged as a double-path system in which the projected beam reflected by wafer W is again reflected by wafer W, and can therefore have higher sensitivity for detection of an error in the wafer W surface position in the Z-direction in comparison with a single-path system.

In this embodiment, a glass block (prism mirror 200) is provided at the extreme end of the focus/tilt detection system and is positioned so as to be partially immersed in liquid LQ, so that the projected beam and the reflected beam do not pass any interface between liquid LQ and air, thus providing a stable beam path. Moreover, the effective length of the path in liquid LQ through which the projected beam or reflected beam travels is reduced by virtue of the prism mirror 200, thereby avoiding any reduction in accuracy due to temperature variation of liquid LQ at the time of Z-position measurement.

Figure 11A:
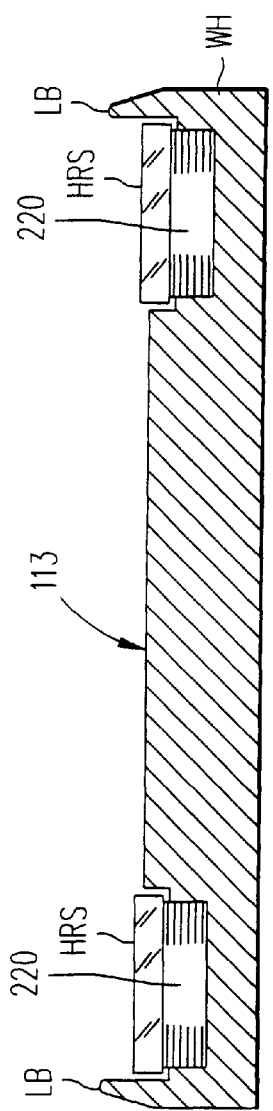
FIGS. 11A and 11B are cross-sectional views of modified examples of the wafer holder.

Modified examples of the structure of the wafer holder WH shown in FIGS. 1 and 5 are described with reference to FIGS. 11A and 11B. FIG. 11A is a cross-sectional view of a wafer holder WH to be mounted in a projection exposure apparatus for performing immersion exposure. In this example, fine Z-drive units 220 such as piezoelectric elements are provided which can slightly move an auxiliary plate HRS surrounding an attraction surface 113 on which wafer W is supported. The fine Z-drive units 220 move the auxiliary plate HRS in the Z-direction by a stroke of about several tens of micro-meters.

If the difference between the height of the surface of wafer W placed on the attraction surface 113 of the wafer holder WH and the height of surface of the auxiliary plate HRS in the Z-direction is larger than an allowable difference, this Z-drive unit 220 is used to correct the height of surface of the auxiliary plate HRS so that the difference is reduced to a value smaller than the allowable value.

As mentioned above with reference to FIG. 5, the surface of the auxiliary plate HRS functions as an alternative detection surface for the focus detection points FA1 (or FA2), FC1 (or FC2), and FD1 (or FD2) located outside wafer W when shot area SA1 at the peripheral portion of wafer W is exposed. However, when inner shot area SA2 (see FIG. 5) of wafer W is exposed, these focus points are positioned on wafer W. Therefore, the focus detectors GDA1, GDA2, GDC1, GDC2, GDD1, and GDD2 having detection points each of which is not exclusively positioned on one of the surface of the auxiliary plate HRS and the surface of wafer W must accurately measure the Z-position on each of these surfaces. That is, it is necessary for the positions in the Z-direction of the surfaces of the auxiliary plate HRS and wafer W to be within the linear focus measuring range of the each focus detectors GDAn, GDCn and GDDn.

For example, if the linear focus measuring range of the focus detectors is ±10 micrometers, the Z positional deviations of the surfaces of the auxiliary plate HRS and wafer W are limited within the range of several micrometers. However, the thickness of wafers varies in a tolerance determined by the SEMI standard, and it is difficult to limit the thicknesses of all usable wafers within the range of several micro-meters.

Therefore, when wafer W is attracted to the wafer holder WH shown in FIG. 11 before exposure, the difference between the Z-position of a suitable portion of the wafer W surface (e.g., a central portion of a peripheral shot area) and the Z-position of the surface of the auxiliary plate HRS is measured by using one of the focus detection systems (GDL, GRD, GDC) before exposure. If the difference exceeds the allowable range (e.g., several micro-meters), the height of the auxiliary plate HRS is adjusted so that the difference is within the allowable range by controlling the fine Z-drive units 220 shown in FIG. 11A. Since the wafer holder WH shown in FIG. 11A is filled with liquid LQ, the fine Z-drive units 220 are "waterproofed" to prevent the liquid from entering the units.

Figure 11B:
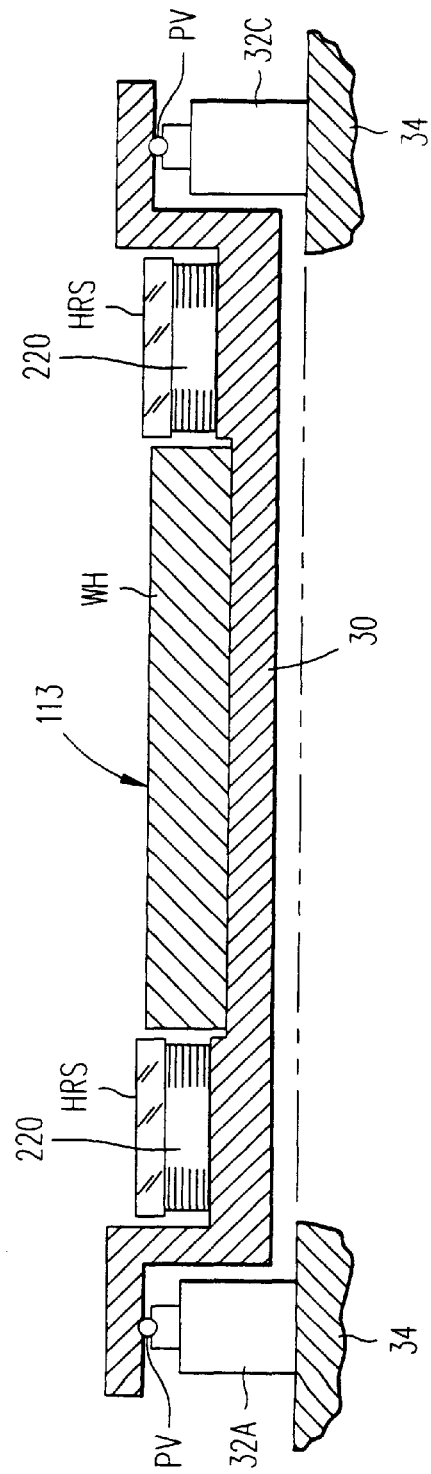

The construction shown in FIG. 11B is next described. FIG. 11B is a cross-sectional view of a modified example of the structure including a wafer holder WH and a ZL stage 30, which is suitable for exposure of a wafer in air. The components corresponding to those shown in FIG. 11A are indicated by the same reference characters or numerals.

Referring to FIG. 11B, the wafer holder WH is constructed as a chuck on which only an attraction surface 113 for supporting wafer W is formed, and which is fixed on a ZL stage 30.

An auxiliary plate HRS is mounted on the ZL stage 30 with fine Z-drive units 220 interposed therebetween. Each function point PV of three Z-actuators 32A, 32C, and 32B (32B not being seen in FIG. 11B) for driving the ZL state 30 in the Z-direction and a tilting direction are set to points at a peripheral portion of the ZL stage 30 substantially at the same height as the wafer mount surface (attraction surface 113) of the wafer holder WH.

Also in the arrangement shown in FIG. 11B, the height of the auxiliary plate HRS is adjusted to that of the upper surface of wafer W by using fine Z-drive units 220 in the same manner as shown in FIG. 11A. This structure of the ZL stage 30 and the Z-actuators 32 shown in FIG. 11B, in which the height of the height of the function points PV are set to the same level as the wafer surface, may also be applied to the aligner shown in FIG. 1. Also, the wafer holder WH of FIG. 11A may be mounted on the ZL stage 30 of FIG. 11B to form a focusing and tilting stage suitable for immersion projection exposure apparatus or its method.

The present invention has been described with respect to applications to exposure apparatus. However, the above-described embodiments can be modified in various ways with-out departing from the scope of the present invention. For example, the focus detection systems GDL, GDR, and GDC may include electrostatic capacity type gap sensors or air micrometer type gap sensors in the case of an aligner for performing projection exposure in air. Also, the present invention is applicable e.g. to any of the step-and-repeat type, step-and-scan type and "1×" scanning type projection aligners using, as exposure light, g-line (463 nm) or i-line (365 nm) from a mercury discharge lamp or pulse light (248 nm) from KrF excimer laser.

According to the present invention, precise focusing and tilt control at the exposure position can be realized while the working distance of the projection optical system mounted in the projection aligner is set to an extremely small value, so that correction of various aberrations and distortion correction in optical design of the projection optical system become easier and the transparent optical element positioned near the image plane, in particular, can be reduced in size.

Each of the focusing/tilt control systems in accordance with the above-described embodiments of the present invention is applicable to a certain type of projection exposure apparatus. However, the present invention is also applicable to focus/tilt detection systems for beam processing (manufacturing) apparatuses, writing apparatuses, inspection apparatuses and the like and is not limited to semiconductor fabrication. These beam processing apparatuses, writing apparatuses and inspection apparatuses are provided with an optical or electrooptical objective system to which the present invention can be applied as a focus detection system for detecting a focus on a substrate, specimen or workpiece.

Figure 12A:
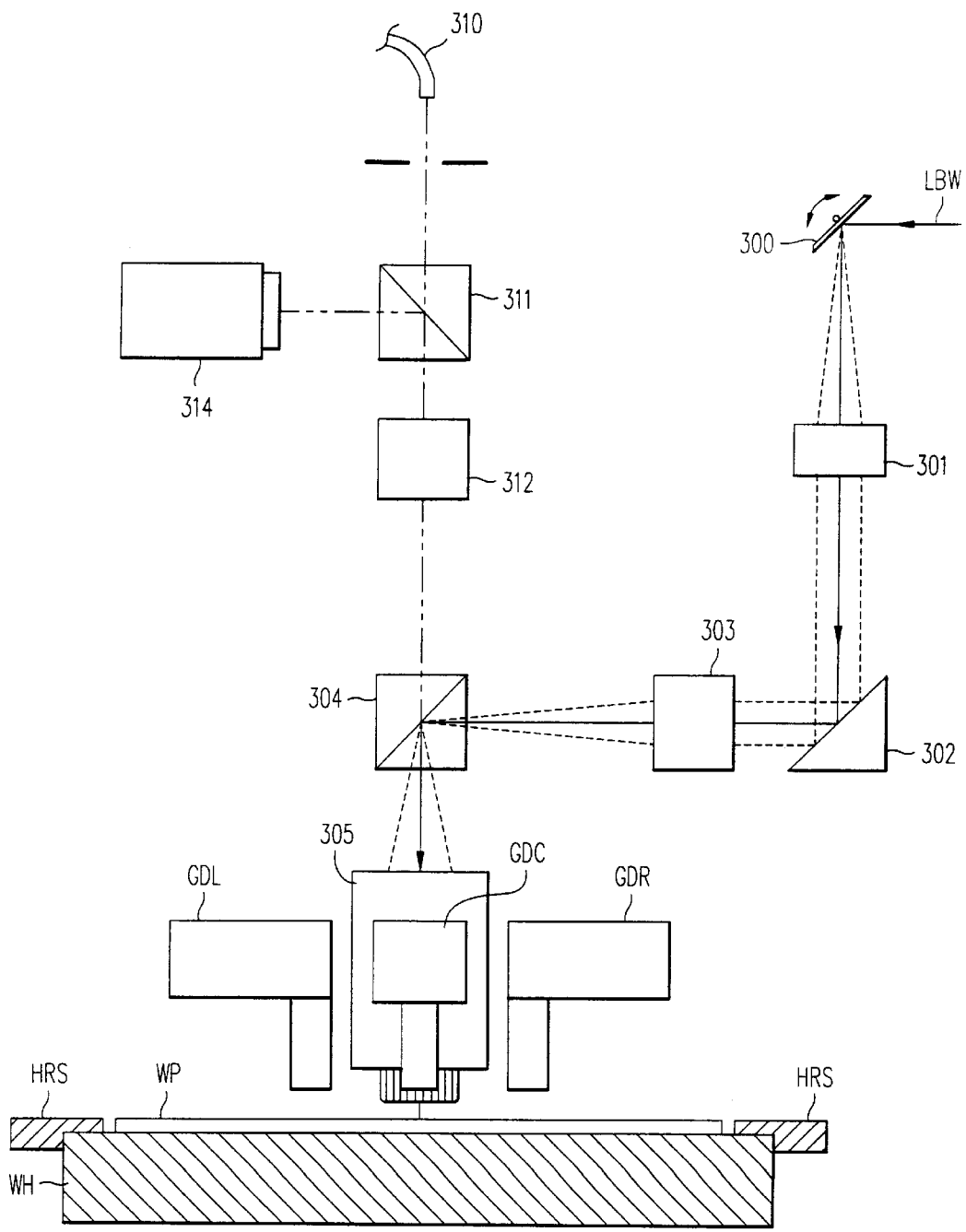
FIG. 12A is a diagram showing an example of a manufacturing or imaging or writing apparatus to which the focus detection sensor of the present invention is applied.
Figure 12B:
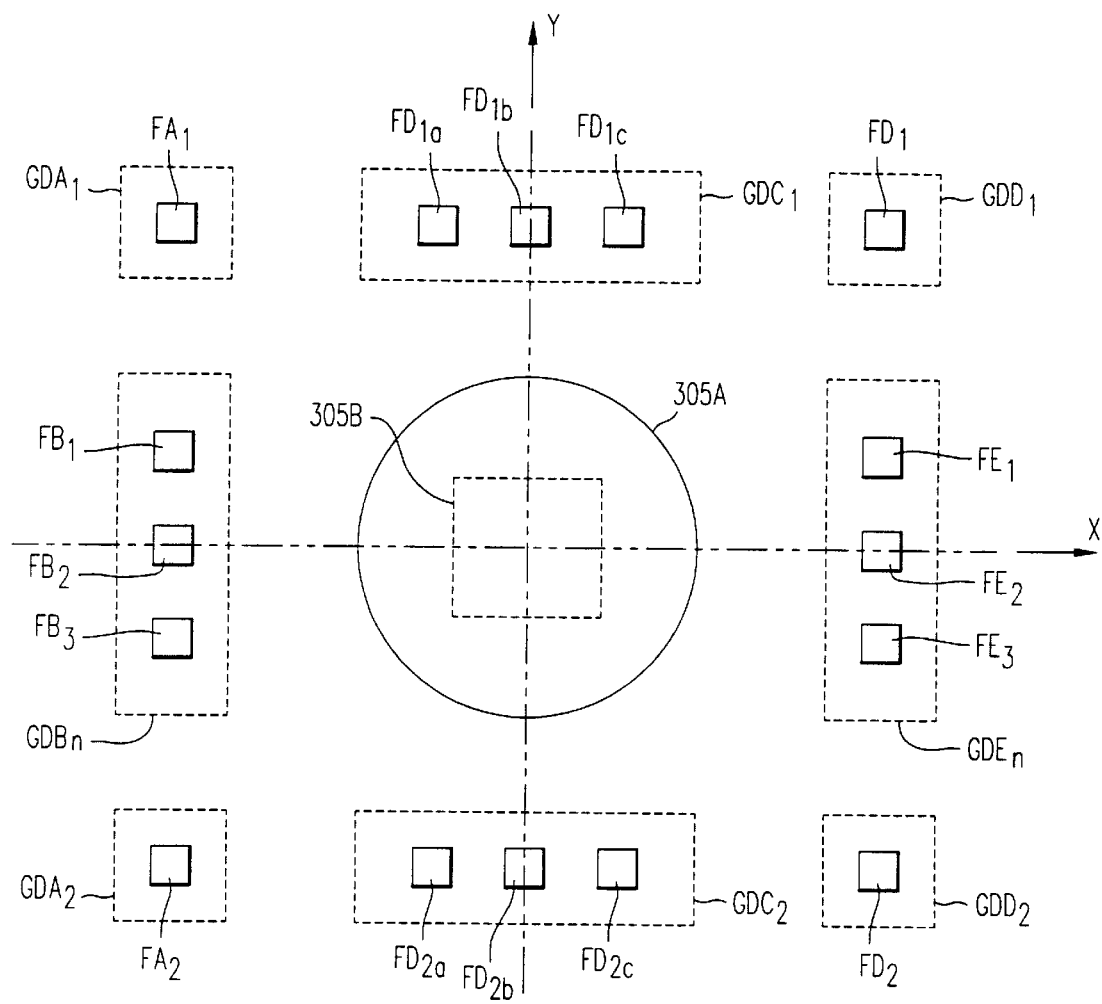
FIG. 12B is a plan view showing an exemplary layout of the focus detection system applied to the apparatus shown in FIG. 12A.

FIG. 12A shows the construction of a focus detection system applied to an objective optical system of an apparatus for processing a workpiece with a laser or electron beam or for writing a pattern on a workpiece, and FIG. 12B shows a planar layout of detection points of the focus detection system shown in FIG. 12A.

Referring to FIG. 12A, a processing or writing beam LBW is deflected unidimentionally or two-dimensionally by a scanning mirror 300 and travels via a lens system 301, a fixed mirror 302 and a lens system 303 to be incident upon a beam splitter 304. The beam LBW is reflected by the beam splitter 304 to be incident upon a high-resolution objective system 305 having a small working distance. The beam LBW is condensed into a small spot having a predetermined shape (e.g., a variable rectangular shape) on a workpiece WP by the objective system 305.

The workpiece WP is attracted to and fixed on the same holder WH as that shown in FIG. 11A or 11B. An auxiliary plate HRS is attached integrally to the holder WH around the workpiece WP. The holder WH is fixed on an unillustrated XYZ-stage to be moved two-dimensionally in a horizontal direction and in a direction perpendicular to paper as viewed in FIG. 12A. The holder WH is also moved slightly in the vertical direction (Z-direction) for focusing.

The apparatus shown in FIG. 12A is also provided with an optical fiber 310 for emitting illumination light for observation, alignment or aiming, a beam splitter 311 and a lens system 312 for leading the illumination light to the above-mentioned beam splitter 304, and a light receiving device (e.g. or photomultiplier, image pickup tube, CCD or the like) 314 for photoelectrically detecting reflected light, scattered and diffracted light or the like from the workpiece WP obtained through the objective system 305.

Pre-reading focus detection systems GDL and GDR and a processing position focus detection system GDC are provided around the objective system 305. FIG. 12B shows a field 305A of the objective system 305 and a planar layout of detection points of the focus detection systems disposed around the field 305A. For convenience, the center of the field 305A is set at the origin of an XY coordinate system. A rectangular area in the field 305A indicates the range through which the spot of the beam LBW scans by the deflection of the beam caused by the scanning mirror 300.

Focus detectors GDA1, GDBn, and GDA2 on the left-hand side of the field 305A of the objective system are disposed so that detection points FA1, FB1, FB2, FB3, and FA2 is set in a row parallel to the Y-axis. Also, focus detectors GDD1, GDEn, and GDD2 on the right-hand side of the field 305A are disposed so that detection points FD1, FE1, FE2, FE3, and FD2 is set in a row parallel to the Y-axis.

On the other hand, a focus detector GDC1 provided above the field 305A is set so that three detection points FD1a, FD1b, and FD1c are placed on a line passing the two detection point FA1 and FD1 and parallel to the X-axis while a focus detector GDC2 provided below the field 305A is set so that three detection points FD2a, FD2b, and FD2c are placed on a line passing the two detection point FA2 and FD2 and parallel to the X-axis. In this embodiment, a set of the focus detectors GDA1, GDBn and GDA2 and a set of the focus detectors GDD1, GDEn and GDD2 are selected as the focus pre-reading function while the workpiece WP moves in the X-direction. On the other hand, the focus pre-reading function is achieved by selecting a set of the focus detectors GDA1, GDC1 and GDD1 and a set of the focus detectors GDA2, GDC2 and GDD2 while the workpiece WP moves in the Y-direction. This embodiment is arranged so that the detection points of the focus detectors GDBn, GDC1, GDC2, and GDEn can be changed for detecting a focus of the processing position. For example, when the workpiece WP is moved in the X direction from the left-hand side to the right-hand side of FIG. 12, one of three pairs of detection points FD1a and FD2a, detection points FD1b and FD2b, and detection points FD1c and FD2c may be selected for focus detection of the processing position while the detection points FA1, FB1, FB2, FB3, and FA2 are being used for pre-reading.

This arrangement is intended to achieve an effect described below. That is, the position of the spot of the processing or drawing light beam LBW changes in the is scanning range 305B. Therefore, when for example, the light spot is positioned at the leftmost end of the scanning range 305B as seen in FIG. 12B, the two detection points FD1a and FD2a are selected for processing position focus detection. When the light spot is positioned at the rightmost end of the scanning range 305B, the two detection points FD1c and FD2c are selected for processing position focus detection.

In this manner, the reproducibility and accuracy of focus control or tilt control are improved. The holder 12A shown in FIG. 12A is slightly moved in the focusing (Z) direction and in a tiling directions on the XY stage. As is a drive system and a control system for this movement, those shown in FIG. 4 can be used without being substantially modified.

As described above, the focus detection system shown in FIG. 12A and 12B is arranged to enable pre-reading detection of the focus in each of the directions of the two-dimensional movement of workpiece WP and to enable the focus detection point for the processing position to be selected according to the position of the beam spot in the field 305. As a result, even a peripheral portion of workpiece WP is precisely processed (imaged) in an accurately focused state or pattern imaging can be performed thereon in such a state.

Figure 13:
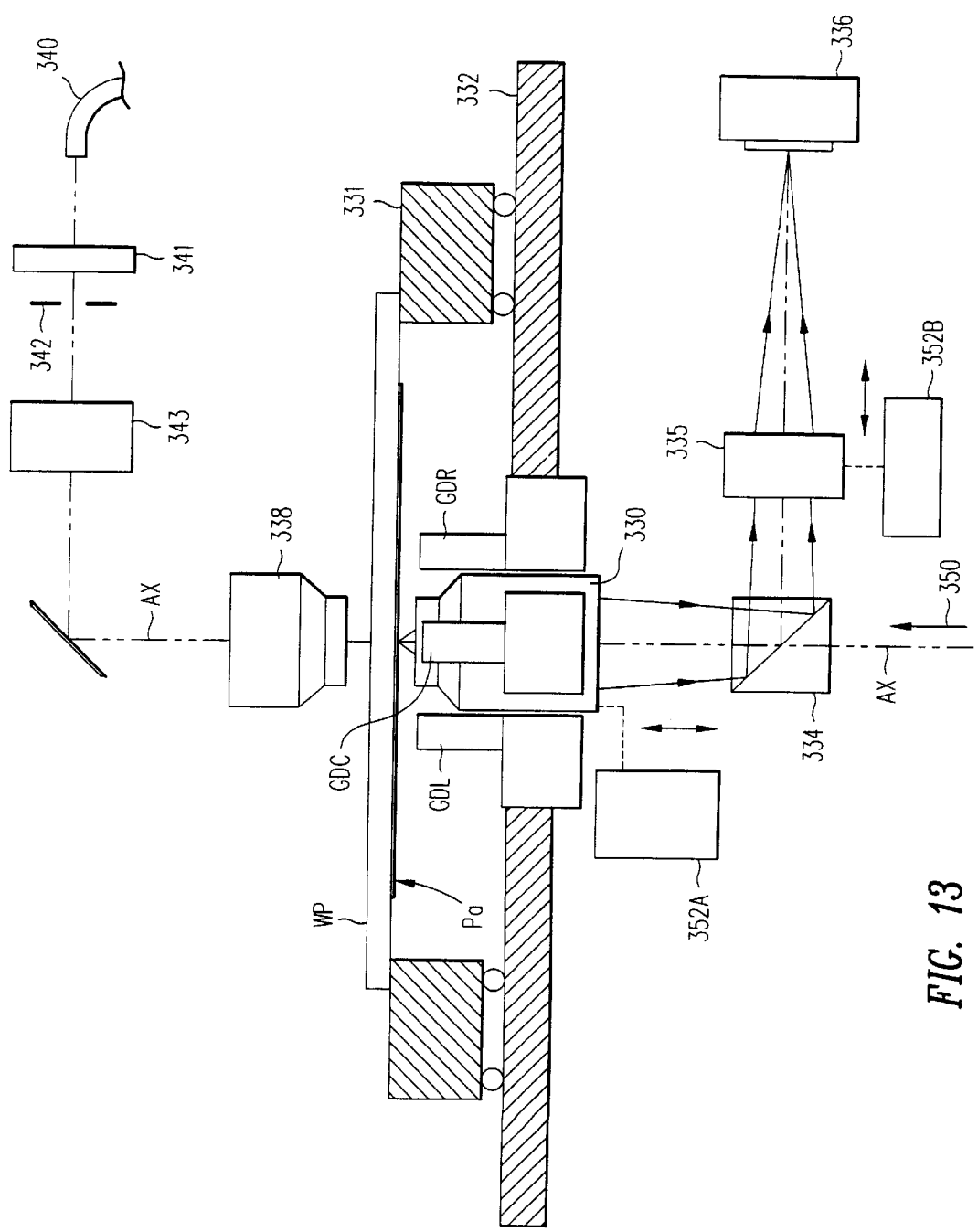
FIG. 13 is a diagram schematically showing the construction of an exemplary inspection apparatus to which the focus/tilt detection system of the present invention is applied.

An inspection apparatus to which the focus/tilt detection system of the present invention can be applied is described briefly with reference to FIG. 13 which shows an example of an apparatus for optically inspecting defects in patterns drawn on a mask or reticle for photolithography or defects in circuit patterns of a semiconductor device or liquid crystal display device formed on a substrate.

In recent years, techniques for examining the quality of an inspected pattern formed on a specimen (substrate) and checking the presence or absence of extraneous materials or particles and damage by enlarging the inspected pattern through an objective optical system, by forming an enlarged image of the pattern by a CCD camera or the like and by analyzing an image signal obtained from such an image have been constructively introduced into this kind of inspection apparatus.

In such a case, it is important to improve the accuracy with which an accurately enlarged image of the inspected pattern is obtained. An objective system having high resolution and a large field size and capable of forming an image with minimized aberrations and distortion is therefore required. Such an objective system naturally has a small working distance and is ordinarily designed as a through the lens (TTL) type such that focus detection is made through the objective system. However, a TTL optical focus detection system entails a problem of limiting the detection sensitivity (the amount of change in detection signal with respect to an error in focusing a specimen) because of a restriction due to the numerical aperture (NA) of the objective system.

If a TTL focus detection system is formed so as to use light having a wavelength different from that of illumination light for inspection, aberration correction must be taken into consideration with respect to the wavelength ranges of inspection illumination light and focus detection illumination light in the optical design of the objective system. In such a case, the lens cannot always be designed optimally with respect to inspection illumination light.

Then, as shown in FIG. 13, a plurality of sets of focus detection systems GDC, GDL, and GDR are provided around an objective lens 330 for inspection in the same manner as those shown in FIGS. 12A and 12B. A specimen WP to be inspected is e.g. a mask having a pattern Pa formed on its lower surface. The specimen WP is supported at its peripheral end on a frame-like two-dimensionally-movable stage 331 having an opening. The objective lens 330 is mounted in an upward-facing state on a base member 332 for guiding movement of the stage 331. An enlarged image of a local area in pattern Pa is imaged on an imaging plane of an image pickup device 336 through a beam splitter 334 and a lens system 35.

On the opposite side of the specimen WP, a condenser lens 338 of an illumination optical system is disposed coaxial with the axis AX of the objective lens 330. Illumination light from an optical fiber 340 travels through a condenser lens 341, an illumination field stop 342 and a lens system 343 to be incident upon the condenser lens 338, thereby irradiating the area on the specimen WP corresponding to the field of the objective 330 with a uniform illuminance.

In the above-described arrangement, the focus detection systems GDC, GDL and GDR are mounted on the base member 332 together with the objective 30 so as to upwardly face the pattern Pa. A plurality of focus detectors (a plurality of detection points) are provided in the focus detection systems GDL and GDR provided for pre-reading, while at least one pair of focus detectors is provided in the focus detection system GDC for detection at the inspection position.

Also in the focus detection system shown in FIG. 13, the specimen WP on the stage 331 may be moved vertically along the optical axis AX or tilted on the basis of focus position information detected by the focus detectors by using a control circuit such as that shown in FIG. 4. In the inspection apparatus shown in FIG. 13, however, only an effect of obtaining a high-quality enlarged image of the pattern Pa imaged by the image pickup device 36 may suffice. Therefore, a focus adjuster 352A or 352B for slightly moving the objective lens 330 or the lens system 335 along the optical axis AX may be provided instead of the means for vertically moving the specimen WP.

An inspection apparatus in which a mask pattern Pa provided as a specimen WP is positioned so as to face downward has been described by way of example with reference to FIG. 13. Needless to say, this embodiment can be directly applied to an inspection apparatus in which pattern Pa faces upward, while the objective lens faces downward. In the apparatus shown in FIG. 13, a transmitted image of pattern Pa is inspected by a coaxial transmission illumination system.

However, the illumination system may be changed so that coaxial reflection illumination light is introduced through the beam splitter 334 in the direction of the arrow 350 in FIG. 13. In such a case, the enlarged image received by the image pickup device 336 is formed by imaging reflected light from the pattern Pa.

Further, another method may be used in which a spatial filter with a transmission portion having a desired shape is removably placed at the position of a Fourier transform plane formed in the optical path of the illumination optical system or in the imaging optical system to enable a bright field image or a dark field image of pattern Pa to be selectively imaged on the image pickup device 336.

This disclosure is illustrative and not limiting; further modifications will be apparent to one of ordinary skill in the art in light of this disclosure, and are intended to fall within the scope of the appended claims.

What is claimed is:

1. A processing apparatus comprising:
   a direction system which directs a processing beam to a principal surface of a workpiece, at least part of the direction system being in a path of the processing beam;
   a first detection system which detects a position of a first area of the principal surface in a Z-direction substantially perpendicular to the principal surface of the workpiece, wherein the first area is located outside a second area of the principal surface of the workpiece to be processed, and wherein the first detection system detects the position of the first area of the principal surface in the Z-direction before the processing beam is directed to the second area;
   a second detection system which detects the position of the first area of the principal surface in the Z-direction when the processing beam is directed to the second area; and
   an adjusting system which adjusts a focus condition of the processing beam on the workpiece based on the position of the first area in the Z-direction detected by the first detection system and the position of the first area in the Z-direction detected by the second detection system.

2. A processing apparatus according to claim 1, wherein the processing apparatus includes an inspection apparatus which inspects the workpiece.

3. A processing apparatus according to claim 1, wherein the processing apparatus includes an exposure apparatus in which a pattern is transferred onto the workpiece.

4. A processing apparatus according to claim 3, wherein the directing system includes a projection system which projects an image of the pattern onto the workpiece.

5. A processing apparatus according to claim 3, wherein the processing beam and the workpiece are relatively moved in a scanning direction during exposure of the workpiece.

6. A processing apparatus according to claim 1, further comprising:
   an auxiliary plate surrounding the workpiece at a height approximately equal to the principal surface of the workpiece.

7. A processing apparatus according to claim 6, wherein the first detection system and the second detection system are arranged to detect a position of a surface of the auxiliary plate in a direction substantially perpendicular to the surface of the plate.

8. A processing apparatus according to claim 1, further comprising:
   a third detection system which detects a position of the second area of the principal surface of the workpiece in the Z-direction when the position of the first area of the principal surface in the Z-direction is detected by the first detection system.

9. A processing apparatus according to claim 1, wherein the processing beam includes a electron beam.

10. A processing method in which a processing beam is directed onto a principal surface of a workpiece, the method comprising:
    detecting a position of a first area of the principal surface in a Z-direction substantially perpendicular to the principal surface of the workpiece, wherein the first area is located outside a second area to be processed by the beam on the workpiece, the detecting occurring before the processing beam is applied to the second area;
    detecting the position of the first area of the principal surface of the workpiece in the Z-direction when the processing beam is applied to the second area on the workpiece; and adjusting a focus condition of the processing beam on the workpiece based on the position of the first area of the principal surface in the Z-direction detected by detecting before the processing beam is applied to the second area and on the position of the first area of the principal surface in the Z-direction detected by detecting when the processing beam is applied to the second area.

11. A processing method according to claim 10, wherein the processing method includes transferring a pattern onto the workpiece.

12. A processing method according to claim 11, wherein the processing beam and the workpiece are relatively moved in a scanning direction during exposure.

13. A processing method according to claim 10, further comprising:

detecting a position of the second area of the principal surface of the workpiece in the Z-direction.

14. A processing method according to claim 10, wherein the processing beam includes an electron beam.

* * * * *

UNITED STATES PATENT AND TRADEMARK OFFICE
CERTIFICATE OF CORRECTION

PATENT NO.     : 6,191,429 B1  
DATED          : February 20, 2001  
INVENTOR(S)    : Kyoichi Suwa It is certified that error appears in the above-identified patent and that said Letters Patent is hereby corrected as shown below:

Column 24,
Line 34, please delete "w" and insert -- W --; and

Column 28,
Line 3, please delete "is".

Signed and Sealed this

Twenty-first Day of January, 2003

JAMES E. ROGAN
*Director of the United States Patent and Trademark Office*